(12) United States Patent
Sun et al.

(10) Patent No.: US 9,748,627 B2
(45) Date of Patent: Aug. 29, 2017

(54) DEVICES AND METHODS RELATED TO DIRECTIONAL COUPLERS

(71) Applicant: SKYWORKS SOLUTIONS, INC., Woburn, MA (US)

(72) Inventors: Weimin Sun, Santa Rosa Valley, CA (US); Xiaofang Mu, Newbury Park, CA (US); Hongxiao Shao, Thousand Oaks, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/825,121

(22) Filed: Aug. 12, 2015

(65) Prior Publication Data

US 2016/0043458 A1    Feb. 11, 2016

Related U.S. Application Data

(60) Provisional application No. 62/011,372, filed on Jun. 12, 2014.

(51) Int. Cl.
*H01P 5/12* (2006.01)
*H01P 5/18* (2006.01)
(Continued)

(52) U.S. Cl.
CPC ............. *H01P 5/18* (2013.01); *H01P 5/185* (2013.01); *H01P 5/187* (2013.01); *H03F 3/24* (2013.01); *H03F 3/68* (2013.01)

(58) Field of Classification Search
CPC .................................. H01P 5/18; H01P 5/184
(Continued)

(56) References Cited

U.S. PATENT DOCUMENTS 3,611,199 A    10/1971  Safran
3,868,594 A *   2/1975  Cornwell ............... H03B 9/147
                                                           331/107 G
(Continued)

FOREIGN PATENT DOCUMENTS

EP          2503701 A2    9/2012
JP       2013126067 A    6/2013
(Continued)

OTHER PUBLICATIONS

International Search Report and Written Opinion from corresponding International Application No. PCT/US2015/044922 dated Dec. 15, 2015.

*Primary Examiner* — Dean Takaoka
(74) *Attorney, Agent, or Firm* — Lando & Anastasi, LLP

(57) ABSTRACT

Devices and methods related to directional couplers. In some implementations, a coupler can include a driver arm and a coupler arm implemented relative to the driver arm to detect power of an RF signal. Portions of the driver and coupler arms can form an overlapping region, with at least one of the driver and coupler arms having a non-straight arm shape. The overlapping region can include a non-zero lateral offset between the driver and coupler arms. In some implementations, a coupler can include a driver arm having input and output sides, and a coupler arm having input and output sides and implemented relative to the driver arm to detect power of an RF signal. The coupler can further include a phase-shifting feature implemented with respect to at least one of the driver and coupler arms to reduce phase difference of power ripples associated with the coupler.

18 Claims, 26 Drawing Sheets

(51) Int. Cl.
*H03F 3/24* (2006.01)
*H03F 3/68* (2006.01)
*H01P 3/08* (2006.01)

(58) Field of Classification Search
USPC .......................................... 333/109–112, 116
See application file for complete search history.

(56) References Cited

U.S. PATENT DOCUMENTS

| | | | |
|---|---|---|---|
| 4,460,875 A | 7/1984 | Harman | |
| 4,677,399 A * | 6/1987 | Le Dain | H01P 5/185 333/116 |
| 4,764,740 A | 8/1988 | Meyer | |
| 5,038,112 A | 8/1991 | O'Neill | |
| 5,222,246 A * | 6/1993 | Wolkstein | H03F 3/602 330/107 |
| 5,276,411 A | 1/1994 | Woodin, Jr. et al. | |
| 5,363,071 A | 11/1994 | Schwent et al. | |
| 5,487,184 A * | 1/1996 | Nagode | H04W 52/04 333/116 |
| 5,745,016 A | 4/1998 | Salminen | |
| 6,020,795 A | 2/2000 | Kim | |
| 6,078,299 A | 6/2000 | Scharfe, Jr. | |
| 6,108,527 A | 8/2000 | Urban et al. | |
| 6,329,880 B2 | 12/2001 | Akiya | |
| 6,496,708 B1 | 12/2002 | Chan et al. | |
| 6,771,141 B2 * | 8/2004 | Iida | H01P 5/185 333/109 |
| 6,972,640 B2 * | 12/2005 | Nagamori | H01P 5/187 333/109 |
| 7,042,309 B2 * | 5/2006 | Podell | H01P 5/187 333/112 |
| 7,305,223 B2 * | 12/2007 | Liu | H01L 23/5227 257/528 |
| 7,319,370 B2 * | 1/2008 | Napijalo | H01P 5/185 333/116 |
| 7,336,142 B2 * | 2/2008 | Vogel | H01P 5/187 333/109 |
| 7,493,093 B2 | 2/2009 | Boerman et al. | |
| 7,538,635 B2 | 5/2009 | Fukuda et al. | |
| 7,546,089 B2 | 6/2009 | Bellantoni | |
| 8,175,554 B2 | 5/2012 | Camuffo et al. | |
| 8,248,302 B2 | 8/2012 | Tsai et al. | |
| 8,289,102 B2 | 10/2012 | Yamamoto et al. | |
| 8,315,576 B2 * | 11/2012 | Jones | H01P 5/184 333/109 |
| 8,417,196 B2 | 4/2013 | Kitching et al. | |
| 8,606,198 B1 | 12/2013 | Wright | |
| 9,014,647 B2 | 4/2015 | Kitching et al. | |
| 9,214,967 B2 * | 12/2015 | Reisner | H04B 1/04 |
| 9,356,330 B1 * | 5/2016 | Donoghue | H01P 3/08 |
| 2002/0113666 A1 | 8/2002 | Yamazaki et al. | |
| 2002/0139975 A1 | 10/2002 | Lewis et al. | |
| 2004/0127178 A1 | 7/2004 | Kuffner | |
| 2005/0040912 A1 | 2/2005 | Pelz | |
| 2005/0146394 A1 | 7/2005 | Podell | |
| 2005/0170794 A1 | 8/2005 | Koukkari et al. | |
| 2007/0159268 A1 | 7/2007 | Podell | |
| 2008/0070519 A1 | 3/2008 | Okabe | |
| 2008/0112466 A1 | 5/2008 | Sasaki | |
| 2009/0134953 A1 | 5/2009 | Hunt et al. | |
| 2011/0057746 A1 | 3/2011 | Yamamoto et al. | |
| 2011/0063044 A1 | 3/2011 | Jones | |
| 2011/0199166 A1 | 8/2011 | Carrillo-Ramirez | |
| 2011/0279192 A1 | 11/2011 | Nash et al. | |
| 2011/0298559 A1 | 12/2011 | Kitching et al. | |
| 2012/0019332 A1 | 1/2012 | Hino et al. | |
| 2012/0243579 A1 | 9/2012 | Premakanthan et al. | |
| 2013/0005284 A1 | 1/2013 | Dalipi | |
| 2013/0113575 A1 | 5/2013 | Easter | |
| 2013/0194054 A1 * | 8/2013 | Presti | H04B 1/0458 333/112 |
| 2013/0207741 A1 | 8/2013 | Presti | |
| 2013/0307635 A1 | 11/2013 | Kase et al. | |
| 2014/0266499 A1 | 9/2014 | Noe | |
| 2014/0368293 A1 | 12/2014 | Mukaiyama | |
| 2015/0002239 A1 | 1/2015 | Tanaka | |
| 2015/0200437 A1 | 7/2015 | Solomko et al. | |
| 2015/0349742 A1 | 12/2015 | Chen et al. | |
| 2016/0028147 A1 | 1/2016 | Srirattana et al. | |
| 2016/0028420 A1 | 1/2016 | Srirattana et al. | |
| 2016/0043458 A1 | 2/2016 | Sun et al. | |
| 2016/0065167 A1 | 3/2016 | Granger-Jones et al. | |
| 2016/0079649 A1 | 3/2016 | Ilkov et al. | |
| 2016/0079650 A1 | 3/2016 | Solomko et al. | |
| 2016/0172737 A1 | 6/2016 | Srirattana et al. | |
| 2016/0172738 A1 | 6/2016 | Srirattana et al. | |
| 2016/0172739 A1 | 6/2016 | Srirattana et al. | |
| 2016/0172740 A1 | 6/2016 | Srirattana et al. | |

FOREIGN PATENT DOCUMENTS

| | | |
|---|---|---|
| KR | 20040037465 A | 5/2004 |
| KR | 20110118289 A | 10/2011 |

* cited by examiner

DEVICES AND METHODS RELATED TO DIRECTIONAL COUPLERS

CROSS-REFERENCE TO RELATED APPLICATIONS

This application claims priority to U.S. Provisional Application No. 62/011,372 filed Jun. 12, 2014 entitled CIRCUITS AND METHODS RELATED TO DIRECTIONAL CHAIN COUPLERS, the disclosure of which is hereby expressly incorporated by reference herein in its entirety.

BACKGROUND

Field

The present disclosure generally relates to directional couplers for radio-frequency (RF) applications.

Description of the Related Art

In some wireless devices, power couplers can be used to, for example, adjust power of transmitted signals for a plurality of bands. Such power couplers can be daisy-chained together to share a coupled line, to thereby space on a circuit board.

SUMMARY

In some implementations, the present disclosure relates to a coupler for detecting power of a radio-frequency (RF) signal. The coupler includes a driver arm configured to route the RF signal, and a coupler arm implemented relative to the driver arm to detect a portion of the power of the RF signal. Portions of the driver arm and the coupler arm form an overlapping region, and at least one of the driver and coupler arms have a non-straight arm shape. The overlapping region includes a non-zero lateral offset between the driver and coupler arms.

In some embodiments, the non-straight arm shape can include a straight section and a first side loop extending parallel with the straight section implemented as part of the driver arm. The non-straight arm shape can further include a second side loop extending parallel with the straight section to form a Phi shape.

In some embodiments, the driver arm can include a C-shape as the non-straight arm shape. The coupler arm can include a C-shape as the non-straight arm shape. The C-shapes of the driver and coupler arms can be arranged in a back-to-back configuration such that portions of straight sections of the C-shapes form the overlapping region. The lateral offset can include the straight sections of the C-shapes being moved away from each other.

In some embodiments, the driver arm can include a 7-shape as the non-straight arm shape. The coupler arm can include a straight section that forms the overlapping region with a straight section of the 7-shape.

In some embodiments, the coupler can further include a phase-shifting feature implemented with respect to at least one of the driver and coupler arms to reduce a difference in phases of power ripples associated with the driver and coupler arms.

According to a number of implementations, the present disclosure relates to a radio-frequency (RF) module that includes a packaging substrate having multiple layers, and a plurality of power amplifiers (PAs) implemented on the packaging substrate. The RF module further includes a coupler assembly implemented relative to the packaging substrate and including a first coupler configured to detect power of an RF signal amplified by a first PA. The first coupler includes a driver arm configured to route the RF signal, and a coupler arm implemented relative to the driver arm to detect a portion of the power of the RF signal. Portions of the driver arm and the coupler arm form an overlapping region, and at least one of the driver and coupler arms have a non-straight arm shape. The overlapping region includes a non-zero lateral offset between the driver and coupler arms.

In some embodiments, the packaging substrate can include a laminate substrate having four or more layers having a layer number i beginning with 1 for the uppermost layer. The driver arm can be implemented over an i-th layer, and the coupler arm can be implemented below the i-th layer. The value of i can be greater than or equal to 2, or greater than or equal to 3.

In some embodiments, the coupler assembly can further include a signal path trace for one side of the coupler arm, with the signal path trace being configured to improve directivity performance of the coupler assembly. The coupler assembly can further include a second coupler configured to detect power of an RF signal amplified by a second PA. The second coupler can include a driver arm configured to route the RF signal, and a coupler arm implemented relative to the driver arm to detect a portion of the power of the RF signal. Portions of the driver arm and the coupler arm of the second coupler can form an overlapping region, with at least one of the driver and coupler arms having a non-straight arm shape. The overlapping region can include a non-zero lateral offset between the driver and coupler arms.

In some embodiments, the first coupler and the second coupler can be connected in a chain configuration. The signal path trace for the first coupler can be an input for the chain configuration of the first and second couplers. The coupler assembly can further include a signal path trace for an output side of the coupler arm of the second coupler, and the signal path trace can be configured to improve directivity performance of the coupler assembly.

In some embodiments, the coupler assembly can further include a phase-shifting feature implemented with respect to at least one of the driver and coupler arms of the first coupler to reduce a difference in phases of power ripples associated with the driver and coupler arms. In some embodiments, the RF module can be a front-end module.

In accordance with some teachings, the present disclosure relates to a radio-frequency (RF) device that includes a transceiver configured to process RF signals, and an antenna in communication with the transceiver. The antenna is configured to facilitate transmission of an amplified RF signal. The RF device further includes an RF module connected to the transceiver. The RF module is configured to generate and route the amplified RF signal to the antenna. The RF module includes a coupler configured to detect power of the amplified RF signal. The coupler includes a driver arm configured to route the amplified RF signal, and a coupler arm implemented relative to the driver arm to detect a portion of the power of the amplified RF signal. Portions of the driver arm and the coupler arm form an overlapping region, and at least one of the driver and coupler arms has a non-straight arm shape. The overlapping region includes a non-zero lateral offset between the driver and coupler arms. In some embodiments, the RF device can be a wireless device.

In a number of implementations, the present disclosure relates to a coupler for detecting power of a radio-frequency (RF) signal. The coupler includes a driver arm having input and output sides, and is configured to route the RF signal. The coupler further includes a coupler arm having input and output sides, and implemented relative to the driver arm to detect a portion of the power of the RF signal. The coupler further includes a phase-shifting feature implemented with respect to at least one of the driver and coupler arms to reduce a difference in phases of power ripples associated with the driver and coupler arms.

In some embodiments, the power ripple associated with the driver arm can include a power ripple on the output side of the driver arm. The power ripple associated with the coupler arm can include a power ripple on the output side of the coupler arm.

In some embodiments, the phase-shifting feature can include a curved feature associated with the corresponding arm. The curved feature can be part of the corresponding arm. The curved feature can overlap with at least a portion of the other arm. The curved feature can have substantially nil overlap with the other arm.

In some embodiments, the curved feature can be part of a connection to or from the corresponding arm. The curved feature can include a partial loop. The curved feature can include at least one loop.

In some embodiments, at least some portions of the driver arm and the coupler arm can form an overlapping region, and at least one of the driver and coupler arms can have a non-straight arm shape. The overlapping region can include a non-zero lateral offset between the driver and coupler arms.

In a number of implementations, the present disclosure relates to a radio-frequency (RF) module that includes a packaging substrate having multiple layers, and a plurality of power amplifiers (PAs) implemented on the packaging substrate. The RF module further includes a coupler assembly implemented relative to the packaging substrate and including a first coupler configured to detect power of an RF signal amplified by a first PA. The first coupler includes a driver arm having input and output sides, and a coupler arm having input and output sides and implemented relative to the driver arm to detect a portion of the power of the RF signal. The first coupler further includes a phase-shifting feature implemented with respect to at least one of the driver and coupler arms to reduce a difference in phases of power ripples associated with the driver and coupler arms.

In some embodiments, the packaging substrate can include a laminate substrate having four or more layers having a layer number i beginning with 1 for the uppermost layer. The driver arm can be implemented over an i-th layer, and the coupler arm can be implemented below the i-th layer. The value of i can be greater than or equal to 2, or greater than or equal to 3.

In some embodiments, the coupler assembly can further include a signal path trace for one side of the coupler arm, and the signal path trace can be configured to improve directivity performance of the coupler assembly. The coupler assembly can further include a second coupler configured to detect power of an RF signal amplified by a second PA. The second coupler can include a driver arm configured to route the RF signal, and a coupler arm implemented relative to the driver arm to detect a portion of the power of the RF signal. The second coupler can further include a phase-shifting feature implemented with respect to at least one of the driver and coupler arms to reduce a difference in phases of power ripples associated with the driver and coupler arms.

In some embodiments, the first coupler and the second coupler can be connected in a chain configuration. The signal path trace for the first coupler can be an input for the chain configuration of the first and second couplers.

In some embodiments, at least some portions of the driver arm and the coupler arm of the first coupler can form an overlapping region, and at least one of the driver and coupler arms can have a non-straight arm shape. The overlapping region can include a non-zero lateral offset between the driver and coupler arms. In some embodiments, the RF module can be a front-end module.

In some teachings, the present disclosure relates to a radio-frequency (RF) device that includes a transceiver configured to process RF signals, and an antenna in communication with the transceiver. The antenna is configured to facilitate transmission of an amplified RF signal. The RF device further includes an RF module connected to the transceiver. The RF module is configured to generate and route the amplified RF signal to the antenna. The RF module includes a coupler assembly having a first coupler configured to detect power of the amplified RF signal. The first coupler includes a driver arm having input and output sides, and a coupler arm having input and output sides and implemented relative to the driver arm to detect the power of the amplified RF signal. The first coupler further includes a phase-shifting feature implemented with respect to at least one of the driver and coupler arms to reduce a difference in phases of power ripples associated with the driver and coupler arms. In some embodiments, the RF device can include a wireless device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
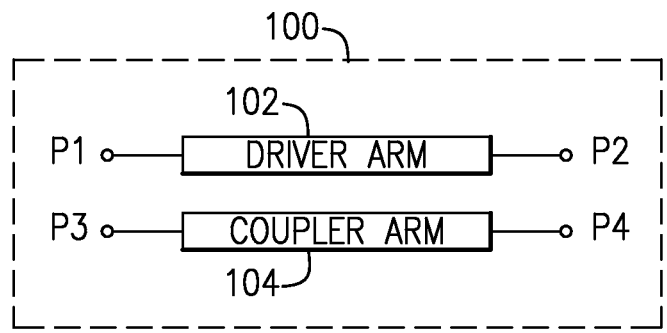
FIG. 1 depicts a coupler having a driver arm and a coupler arm.

Described herein are various examples related to couplers that can be configured for radio-frequency (RF) applications. FIG. 1 depicts a coupler 100 having a driver arm 102 implemented between first and second nodes P1, P2, and a coupler arm 104 implemented between third and fourth nodes P3, P4. In some embodiments, the driver arm 102 can be a part of an RF signal path such as an output path from a power amplifier (PA), and the coupler arm 104 can be a part of a power detection circuit. Various examples related to such a power detecting configuration are described herein in greater detail.

In some embodiments, some or all of the driver arm 102 and the coupler arm 104, and/or pathways that connect such arms to their respective nodes, can be configured to provide desirable performance properties. Examples of such desirable configurations are described herein in greater detail.

In many RF applications, couplers such as 20 dB couplers or 20 dB chain couplers are important parts in front-end module (FEM) products. For example, in a multi-band FEM, a chain coupler can be utilized. However, such a chain coupler can be difficult to design to meet specifications on available laminate technology due to, for example, limited size, multi-frequency operation, and lack of impedance tuning at coupler termination port. In another example, a coupler being utilized to detect and monitor RF output power typically needs to be accurate with minimal detection error. However, a coupler rendering low power detection error can be difficult to design to meet specifications on available laminate technology due to, for example, some or all of the foregoing reasons.

In some embodiments, the coupler 100 of FIG. 100 can include one or more features as described herein to yield improved performance and/or reduced detection error. In some embodiments, a plurality of such couplers can be implemented as a coupler assembly to allow, for example, efficient RF output power detection involving a plurality of frequency bands.

Figure 2:
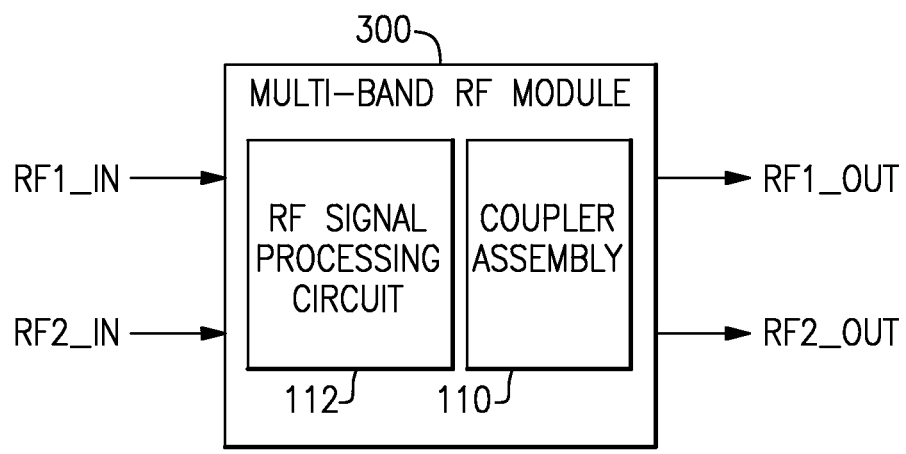
FIG. 2 depicts a multi-band radio-frequency (RF) module that can include one or more couplers as described herein.

For example, FIG. 2 depicts a multi-band RF module 300 (e.g., a FEM) that can be configured to be capable of processing RF signals associated with a plurality of frequency bands. For the purpose of description, it will be understood that "multi-band" can include two or more frequency bands such as cellular bands.

In the example of FIG. 2, the RF module 300 is shown to include an RF signal processing circuit 112 configured to receive and process first and second RF signals RF1_IN, RF2_IN and generate respective output RF signals RF1_OUT, RF2_OUT. In some embodiments, such an RF signal processing circuit can include a power amplifier (PA) circuit configured to amplify power of the input signals RF1_IN, RF2_IN. It will be understood that the RF module 300 can process (e.g., amplify) one of the two RF signals at a given time, both of the two RF signals simultaneously, or any combination thereof.

Referring to FIG. 2, a coupler assembly 110 can be implemented in the RF module 300. In the example context of the RF signal processing circuit 112 being a PA circuit, such a coupler assembly can be configured to, for example, detect power for some or all of the amplification paths associated with the PA circuit. In some embodiments, such a coupler assembly can include at least one coupler (e.g., 100 in FIG. 1) having one or more features as described herein.

Figure 3:
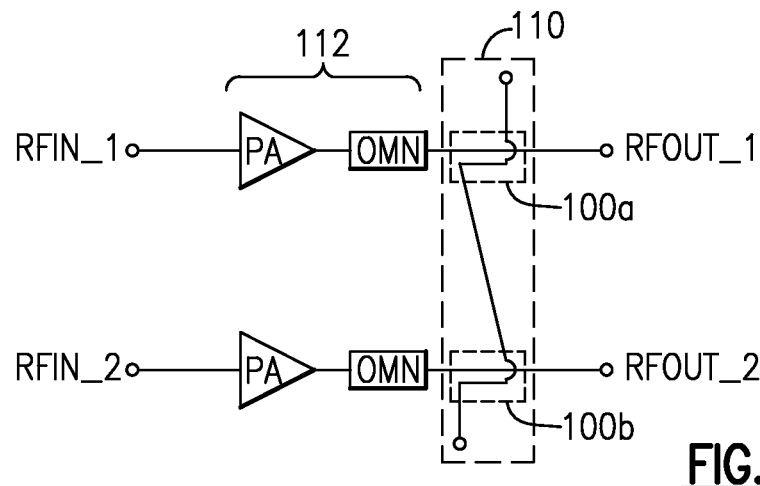
FIG. 3 shows a more specific example of FIG. 2, where a coupler assembly can be implemented for power amplifier (PA) applications involving two bands.
Figure 4:
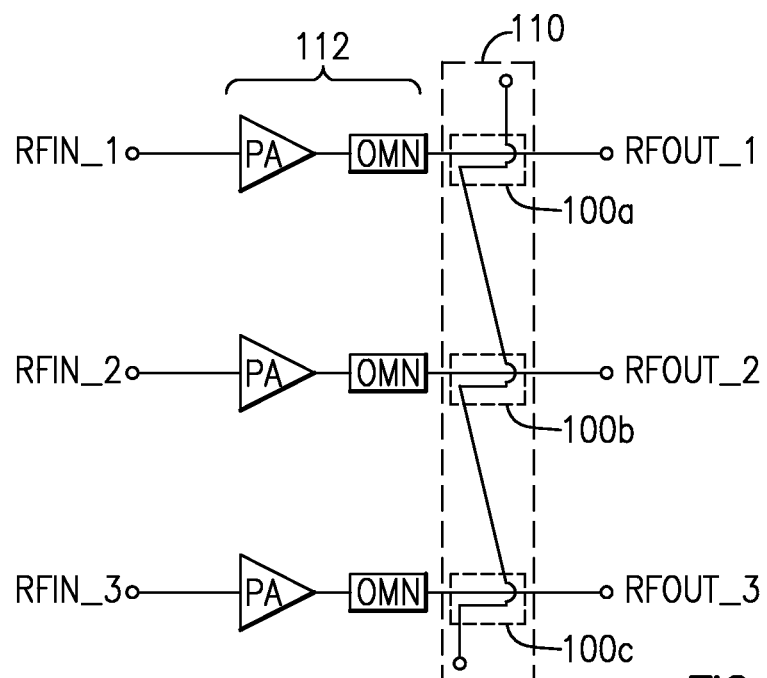
FIG. 4 shows another example of FIG. 2, where a coupler assembly can be implemented for power amplifier (PA) applications involving three bands.

FIGS. 3 and 4 show more specific examples where a coupler assembly 110 can be implemented in multi-band PA applications. In FIG. 3, a multi-band PA application can include two amplification paths. In FIG. 4, a multi-band PA application can include three amplification paths. It will be understood that other numbers of amplification paths can be implemented with a couple assembly having one or more features as described herein.

In the example of FIG. 3, the example two-band configuration is shown to include a first amplification path configured to amplify an input signal RFin_1 to yield an output signal RFout_1, and a second amplification path configured to amplify an input signal RFin_2 to yield an output signal RFout_2. Each amplification path can include a PA and an output matching network (OMN). For the purpose of description, an assembly of such PAs and OMNs of the first and second amplification paths can be collectively referred to as an RF signal processing circuit 112, similar to that of the example of FIG. 2.

In the example of FIG. 3, the example two-band configuration is shown to further include a coupler assembly 110 implemented as a chain coupler. A coupler is shown to be implemented along the output side of the corresponding PA, and two such couplers are shown to be chained together in series between detector nodes. More particularly, a first coupler 100a is shown to be implemented after the OMN of the first amplification path, and a second coupler 100b is shown to be implemented after the OMN of the second amplification path. The first and second couplers 100a, 100b are shown to be connected in series between the detector nodes.

In the example of FIG. 4, the example three-band configuration is shown to further include a third amplification path configured to amplify an input signal RFin_3 to yield an output signal RFout_3. Such an amplification path can include a PA and an output matching network (OMN). For the purpose of description, an assembly of such PAs and OMNs of the three amplification paths can be collectively referred to as an RF signal processing circuit 112, similar to that of the example of FIG. 2.

In the example of FIG. 4, the example three-band configuration is shown to further include a coupler assembly 110 implemented as a chain coupler. A coupler is shown to be implemented along the output side of the corresponding PA, and three such couplers are shown to be chained together in series between detector nodes. More particularly, in addition to the first and second couplers that can be similar to the example of FIG. 3, a third coupler 100c is shown to be implemented after the OMN of the third amplification path. The three couplers 100a, 100b, 100c are shown to be connected in series between the detector nodes.

In each of the examples of FIGS. 3 and 4, each amplification path is shown to be associated with a coupler. It will be understood that in some embodiments, an amplification path in such multi-band configurations may or may not have a coupler. It will also be understood that the couplers in each of the examples of FIGS. 3 and 4 may or may not be configured the same. It will also be understood that while various examples are described herein in the context of chained couplers, one or more features of the present disclosure can also be implemented in other types of couplers and coupler-assemblies.

Figure 5A:
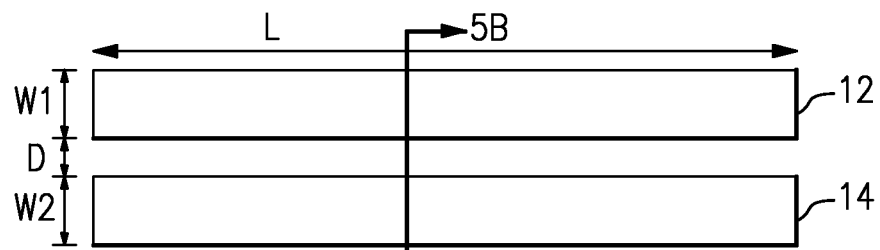
FIGS. 5A and 5B show plan and sectional views of an edge-coupling configuration.
Figure 5B:
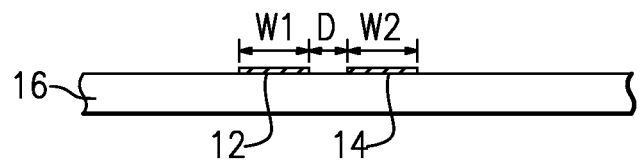
Figure 6A:
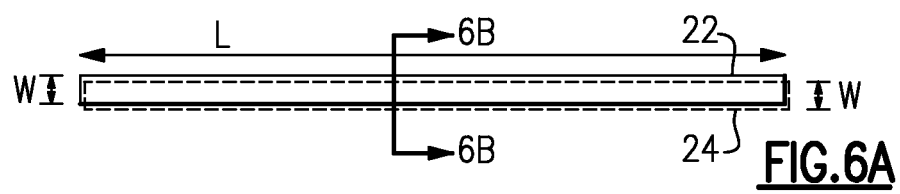
FIGS. 6A and 6B show plan and sectional views of a broad-side-coupling configuration.
Figure 6B:
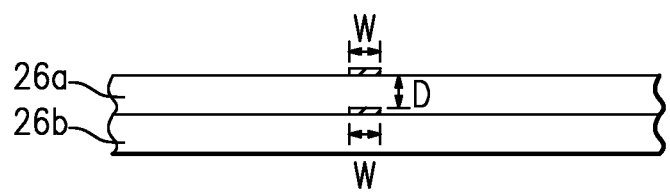

FIGS. 5 and 6 show examples of common couplers that can be utilized in a chain-coupler configuration. FIGS. 5A and 5B show plan and sectional views of an edge-coupled configuration, and FIGS. 6A and 6B show plan and sectional views of a broad-side-coupled configuration.

Referring to FIGS. 5A and 5B, a driver arm 12 and a coupler arm 14 can be implemented as conductive strips having a length L, respective widths W1 and W2. Such conductive strips can be formed on a substrate layer 16 so as to be separated by a gap dimension of d between the neighboring edges. In such a coupling configuration, the conductive strips of the driver and coupler arms can have relatively large footprints. Further, the gap dimension d may need to be small so as to make fabrication difficult, especially in mass-production applications.

Referring to FIGS. 6A and 6B, a driver arm 22 and a coupler arm 24 can be implemented as conductive strips having a length L and a width W. Typically, the width W of such strips (22, 24) are smaller than the widths of the example strips (12, 14) of FIGS. 5A and 5B, so as to provide a narrow broadside coupling configuration. As shown in FIG. 6B, such a narrow broadside coupling can be implemented by forming one strip on one substrate layer (e.g., strip 24 on a substrate layer 26b), and the other strip on another substrate layer (e.g., strip 22 on a substrate layer 26a). In such a configuration, the upper and lower strips (22, 24) are shown to be separated by a distance d which can be approximately the thickness of the substrate layer 26a.

In the examples of FIGS. 5 and 6, it is noted that such coupler configurations can be implemented with relatively easy design and routing. Further, if implemented as a single coupler (e.g., for single-band application), such designs can include tuning with appropriate coupler termination impedance (e.g., fixed at 50 Ohm). However, in chain coupler implementations (e.g., multi-band applications) such tuning generally cannot be realized. As a result, directivity is typically difficult to improve in chain coupler configurations.

It is noted that power couplers such as 20 dB couplers and chain couplers are important elements in multi-band multi-mode front end module (FEM) applications. For example, a coupler's directivity is important to system level power control accuracy and/or management. However, directivity is typically difficult to improve in commonly used technologies such as laminate technology.

As described herein, in multi-band FEM product designs, a plurality of couplers operating at different frequency bands can be cascaded in a chain so as to yield a chain coupler assembly. Good directivity can be more difficult to achieve in such a chain coupler design.

FIGS. 7-33 show various non-limiting examples related to coupler configurations that can be implemented to provide performance improvements. FIGS. 7-25 generally relate to coupler features that can be implemented to address directivity and/or coupling performance. FIGS. 26-33 generally relate to coupler features that can be implemented to address power detection errors. It will be understood that in some embodiments, a coupler and/or an assembly of couplers can include one or more features implemented to address either or both of directivity/coupling performance and power detection performance.

Figure 20:
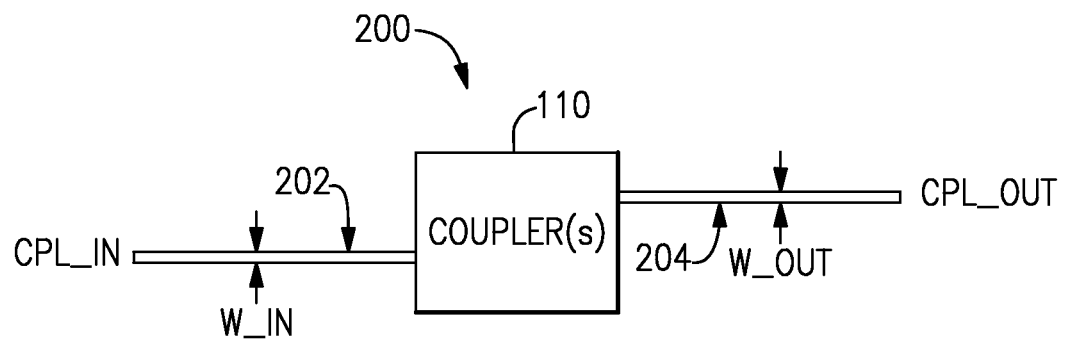
FIG. 20 shows that in some embodiments, input and/or output traces associated with a coupler or a group of couplers can be dimensioned to achieve desired directivity values.
Figure 21:
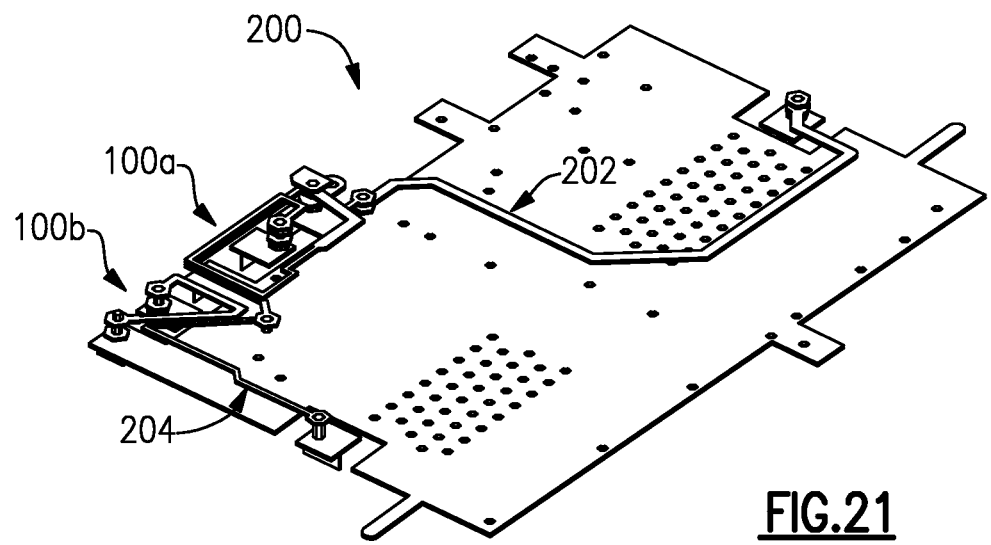
FIG. 21 shows a layout configuration that can be a more specific example of the configuration of FIG. 20.

In some embodiments, a chain coupler can be configured to include one or more of features such as shape(s) of driver and/or coupler arms, alignment offset in broadside coupling, impedance control of input and/or output traces, and depth-position in a substrate assembly. For example, FIGS. 7-11 show examples of how shape(s) of driver and/or coupler arms can impact directivity performance. In another example, FIGS. 12-14 show examples of how alignment offset in broadside coupling can impact coupling and directivity performance. In yet another example, FIGS. 15-19 show more specific examples of driver and/or coupler arm shapes based on variations of C-shapes. In yet another example, FIGS. 20 and 21 show examples of how input and/or output traces can be varied to obtain different directivity levels. In yet another example, FIGS. 22-25 show examples of how depth-position of a coupler in a substrate assembly can impact coupling and directivity performance.

Figure 7A:
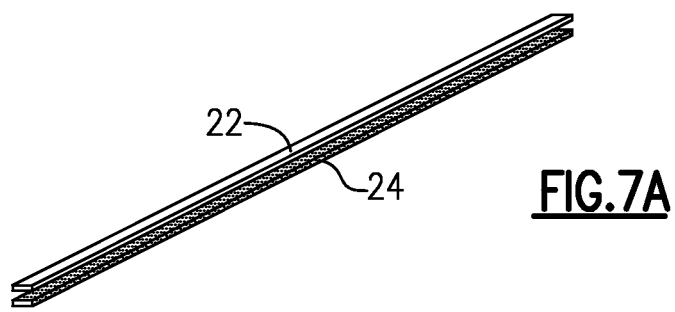
FIGS. 7A-7C show perspective, plan, and sectional views of a coupler having a narrow broadside coupling configuration similar to the example of FIGS. 6A and 6B.
Figure 7B:
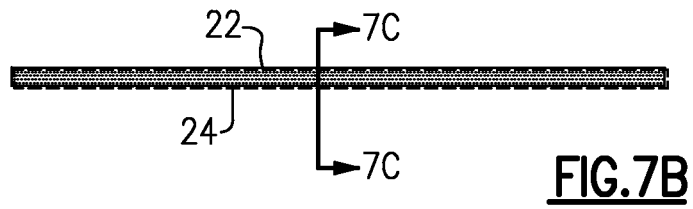
Figure 7C:
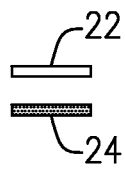

FIGS. 7A-7C show perspective, plan, and sectional views of a coupler having a narrow broadside coupling configuration similar to the example of FIGS. 6A and 6B. In such a configuration, each of a driver arm 22 and a coupler arm 24 can be a relatively narrow and straight conductive strip, and such strips can be separated by, for example, a laminate layer. For the purpose of description related to FIGS. 7-11, such a configuration can be referred to as a line configuration, and also be considered to provide a base level of directivity performance.

Figure 8A:
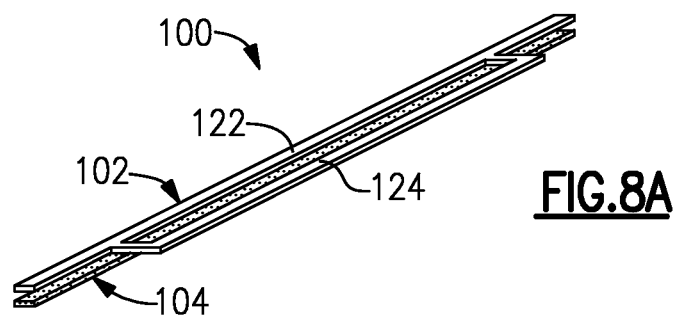
FIGS. 8A-8C show perspective, plan, and sectional views of a coupler having a driver arm with a side loop.
Figure 8B:
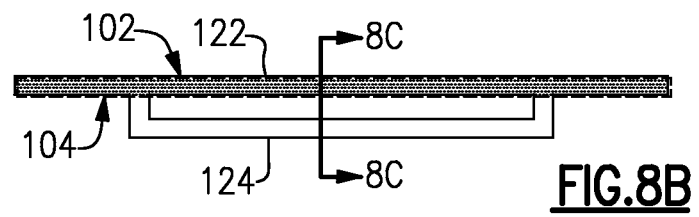
Figure 8C:
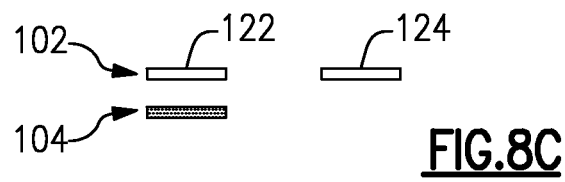

FIGS. 8A-8C show perspective, plan, and sectional views of a coupler 100 having a driver arm 102 and a coupler arm 104 that can be separated by, for example, a laminate layer. The driver arm 102 can include a relatively narrow and straight conductive strip 122, and a loop 124 that extends generally parallel with the strip 122. The coupler arm 104 can include a relatively narrow and straight conductive strip that is positioned approximately below the straight conductive strip 122 of the driver arm 102. For the purpose of description related to FIGS. 7-11, such a configuration can be referred to as a loop configuration. It will be understood that in some embodiments, the foregoing shapes of the driver arm 102 and the coupler arm 104 can be interchanged.

Figure 9A:
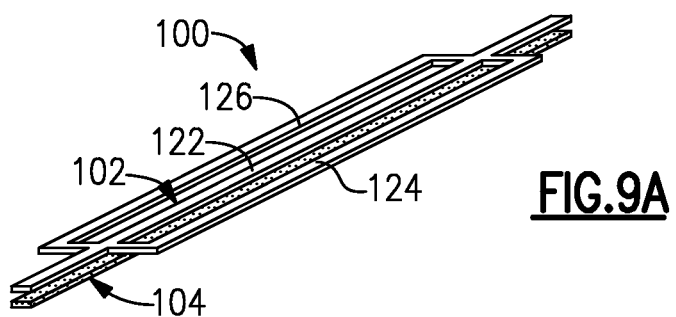
FIGS. 9A-9C show perspective, plan, and sectional views of a coupler having a driver arm with a Phi shape.
Figure 9B:
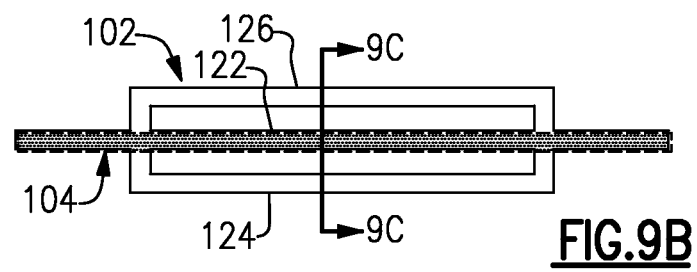
Figure 9C:
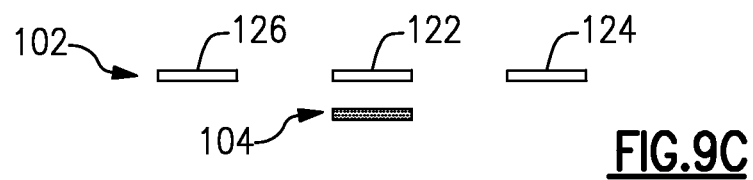

FIGS. 9A-9C show perspective, plan, and sectional views of a coupler 100 having a driver arm 102 and a coupler arm 104 that can be separated by, for example, a laminate layer. The driver arm 102 can include a relatively narrow and straight conductive strip 122, a first loop 124 that extends generally parallel along the first side of the strip 122, and a second loop 126 that extends generally parallel along the second side of the strip 122. Such first and second loops can be similar to each other in dimensions so as to generally form a ϕ (Phi) shape. The coupler arm 104 can include a relatively narrow and straight conductive strip that is positioned approximately below the straight conductive strip 122 of the driver arm 102. For the purpose of description related to FIGS. 7-11, such a configuration can be referred to as a Phi configuration. It will be understood that in some embodiments, the foregoing shapes of the driver arm 102 and the coupler arm 104 can be interchanged.

Figure 10:
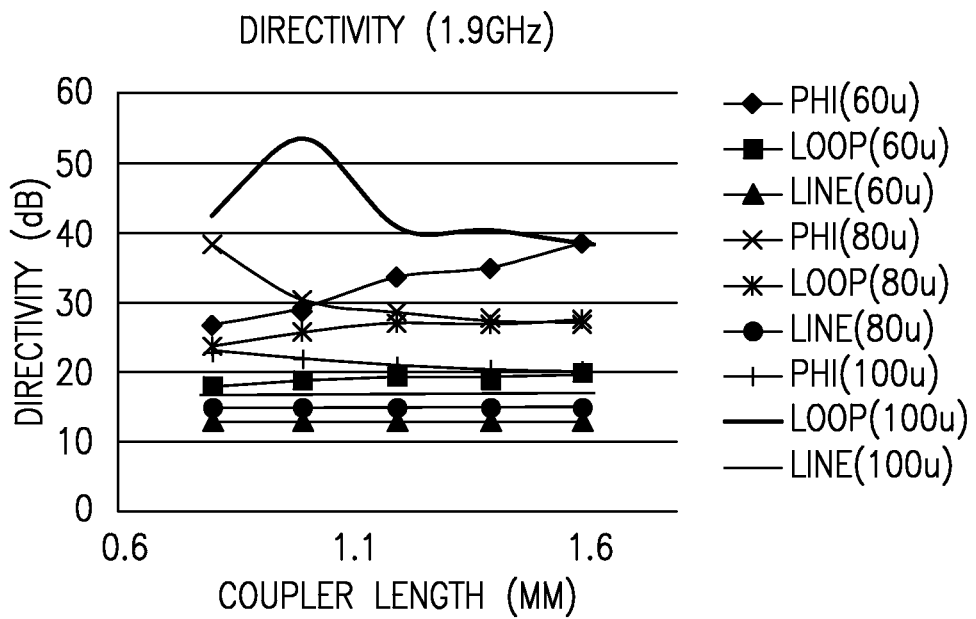
FIG. 10 shows examples of directivity values for the example coupler configurations of FIGS. 7A-7C, FIGS. 8A-8C, and FIGS. 9A-9C, as a function of coupler length.

FIG. 10 shows examples of directivity values for the line (FIGS. 7A-7C), loop (FIGS. 8A-8C), and Phi (FIGS. 9A-9C) configurations as a function of coupler length, obtained at an example frequency of 1.9 GHz. For the purpose of description, such a coupler length can be the length of the straight conductive strip (22 or 122). Three of the nine curves correspond to a width (of the straight conductive strip (22 or 122) and loop(s) (124, 126)) having a value of approximately 60 µm; another three curves correspond to such a width having a value of approximately 80 µm; and the remaining three curves correspond to such a width having a value of approximately 100 µm.

Figure 11:
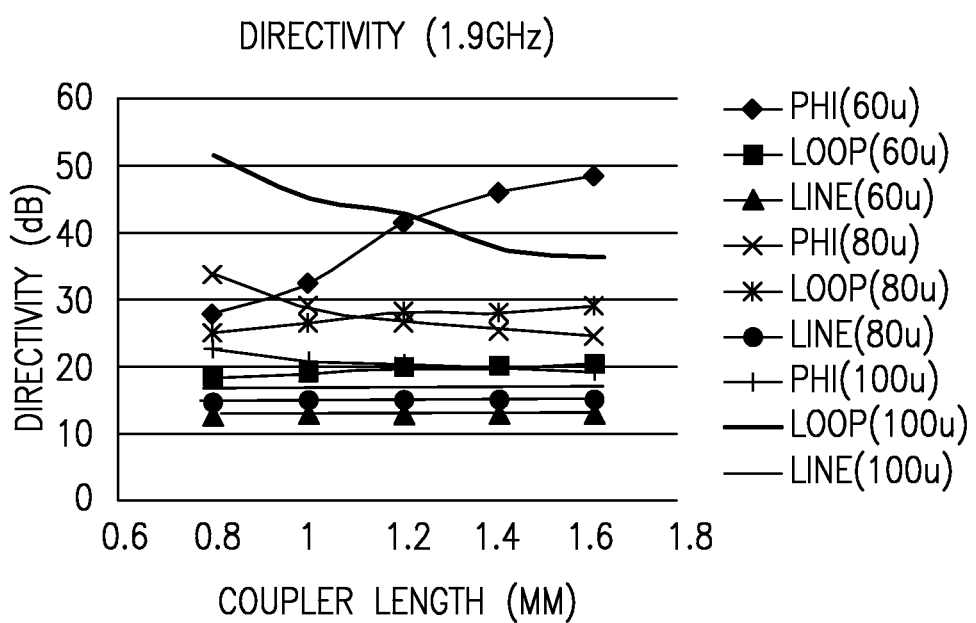
FIG. 11 shows examples of directivity values similar to the example of FIG. 10, but with a different gap dimension between the driver and coupler arms.

In the examples of FIG. 10, a gap between the driver arm 102 and the coupler arm 104 is approximately 60 µm. FIG. 11 shows examples similar to those of FIG. 10, except that a gap between the driver arm 102 and the coupler arm 104 is approximately 80 µm.

Referring to FIG. 10 (60 µm gap), a number of observations can be made. For example, for a given strip width (60, 80 or 100 µm), the loop configuration (FIGS. 8A-8C) provides generally higher directivity values than the line configuration (FIGS. 7A-7C) throughout the example coupler length range of 0.8 mm to 1.6 mm. Similarly, for a given strip width (60, 80 or 100 µm), the Phi configuration (FIGS. 9A-9C) provides generally higher directivity values than the line configuration (FIGS. 7A-7C) throughout the example coupler length range of 0.8 mm to 1.6 mm.

Between the loop and Phi configurations, one can provide higher directivity than the other, depending on the strip width. For example, when the strip width is 60 µm, the Phi configuration provides higher directivity values than the loop configuration. When the strip width is 80 µm, the Phi configuration generally provides higher directivity values than the loop configuration. However, the Phi configuration's directivity decreases as the coupler length increases, and the loop configuration's directivity increases as the coupler length increases, such that at approximately 1.6 mm coupler length, the two configurations provide an approximately same directivity value. When the strip width is 100 µm, the loop configuration provides significantly higher directivity values than the Phi configuration.

Referring to FIG. 11 (80 µm gap), trends similar to those of FIG. 10 can be observed. More particularly, each of the loop and Phi configurations provides generally higher directivity values than the line configuration for a given strip width (60, 80 or 100 µm).

Between the loop and Phi configurations, one can provide higher directivity than the other, depending on the strip width. Similar to the example of FIG. 10, when the strip width is 60 µm, the Phi configuration provides higher directivity values than the loop configuration. When the strip width is 80 µm, the Phi configuration's directivity decreases as the coupler length increases, and the loop configuration's directivity increases as the coupler length increases (similar to the example of FIG. 10) such that a cross-over in directivity curves occurs at approximately 1.1 mm coupler length. Thus, when the coupler length is less than about 1.1 mm, the Phi configuration provides higher directivity values than the loop configuration; and when the coupler length is greater than about 1.1 mm, the Phi configuration provides lower directivity values than the loop configuration. When the strip width is 100 µm, the loop configuration provides significantly higher directivity values than the Phi configuration, similar to the example of FIG. 10.

Based on the foregoing examples related to FIGS. 7-11, one can see that improved and desirable coupler directivity performance can be achieved by configuring a coupler based on one or more of design parameters such as coupler length, strip width, gap between the driver and coupler arms, and the shape of one or more of the driver and coupler arms.

Figure 12A:
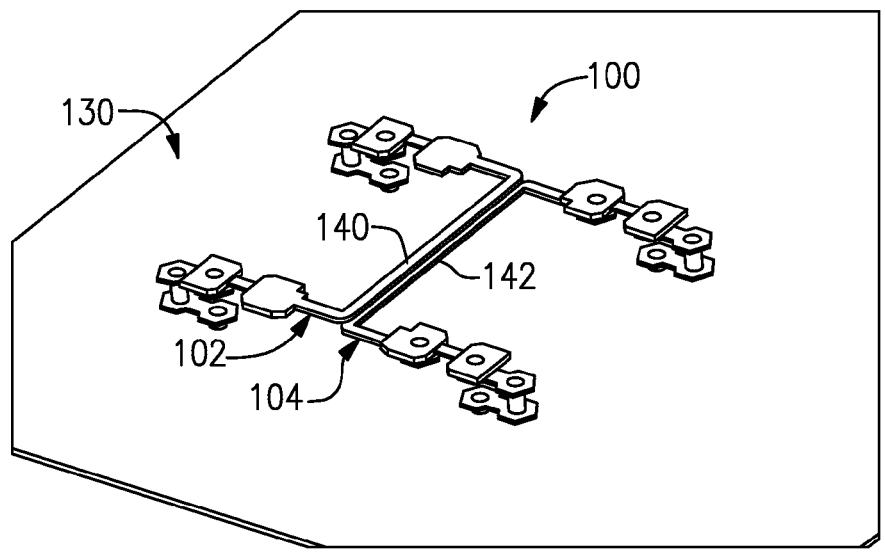
FIG. 12A shows a coupler having two C-shaped arms arranged in a back-to-back configuration.
Figure 12B:
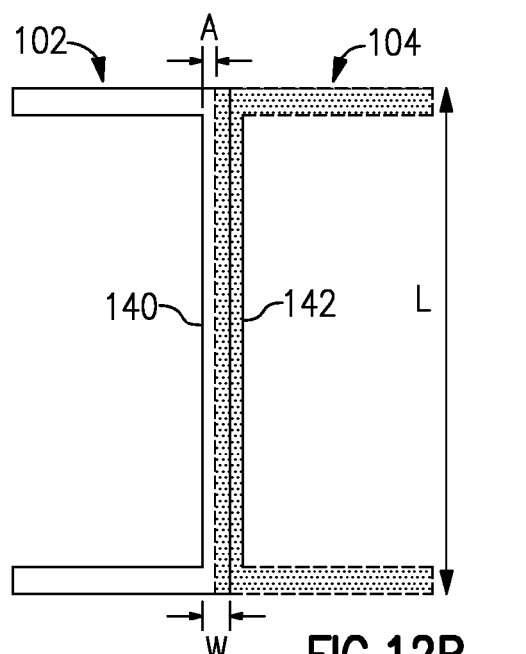
FIG. 12B shows the coupler of FIG. 12A in which the driver and coupler arms can be laterally offset in one direction.
Figure 12C:
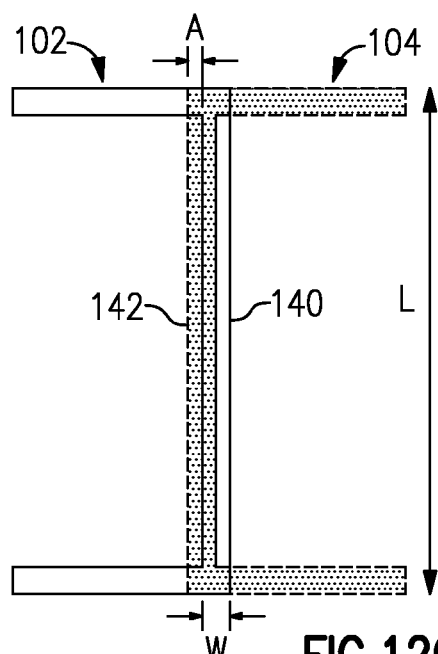
FIG. 12C shows the coupler of FIG. 12A in which the driver and coupler arms can be laterally offset in another direction.
Figure 13:
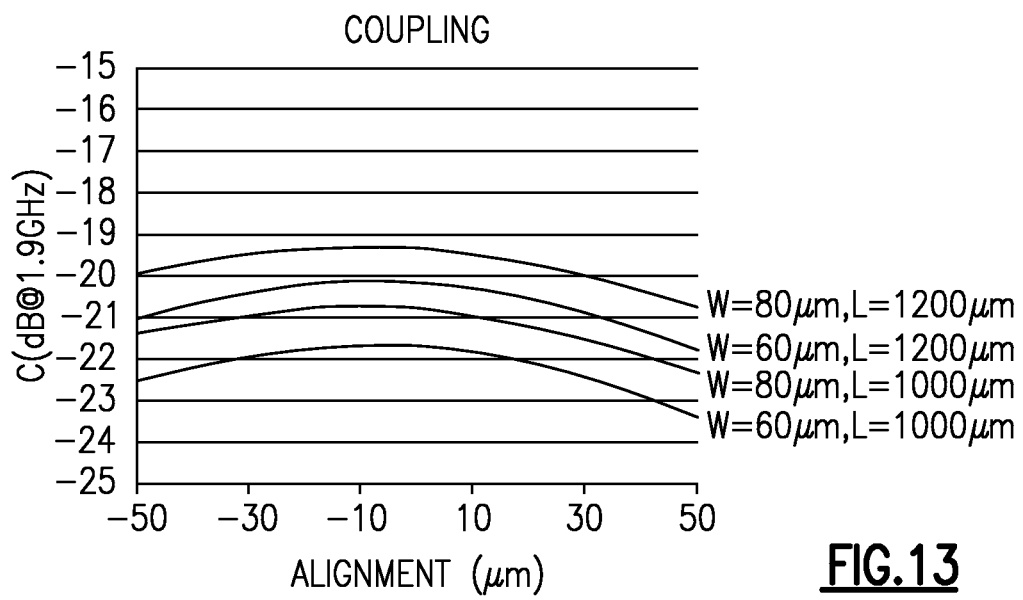
FIG. 13 shows examples of coupling values for the example back-to-back C-shaped configuration of FIGS. 12A-12C as a function of lateral alignment offset.
Figure 14:
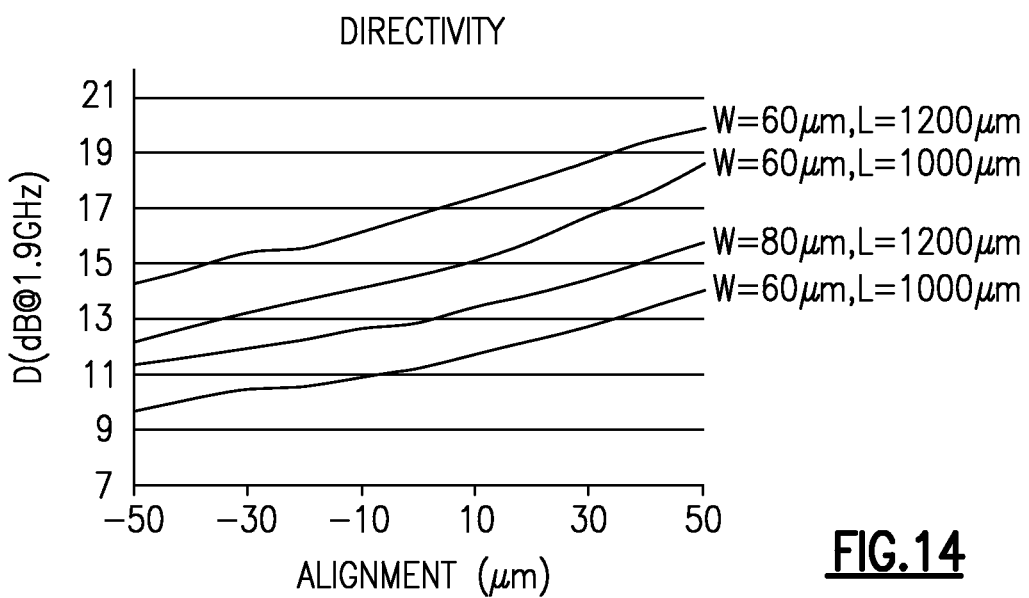
FIG. 14 shows examples of directivity values for the example back-to-back C-shaped configuration of FIGS. 12A-12C as a function of lateral alignment offset.

FIGS. 12-14 show examples of how alignment offset in broadside coupling can impact coupling and directivity performance. FIG. 12A shows a perspective view of a coupler 100 having a driver arm 102 and a coupler arm 104 that can be separated by, for example, a laminate layer or some other insulator layer. The driver arm 102 can be implemented in a C-shape that includes a straight section 140, and perpendicular extension sections from both ends of the straight section 140. Such sections can be implemented as, for example, conductive strips so as to form the C-shape; and the ends of the extension sections can be connected to their respective terminals. Similarly, the coupler arm 104 can be implemented in a C-shape that includes a straight section 142, and perpendicular extension sections from both ends of the straight section 142. Such sections can be implemented as, for example, conductive strips so as to form the C-shape; and the ends of the extension sections can be connected to their respective terminals.

In the example of FIG. 12A, the two C-shaped arms of the coupler 100 are implemented so as to be in a back-to-back configuration when viewed from above. FIGS. 12B and 12C show such a plan view of the driver and coupler arms 102, 104. Each of the straight sections 140, 142 is shown to have a length of L and a width of W. In the example of FIG. 12B, a lateral alignment offset of A is in a direction where the perpendicular extension sections move away from each other from a position in which the straight sections 140, 142 are substantially aligned. For the purpose of description of FIGS. 12-14, such a direction can be considered to be a positive direction. In the example of FIG. 12C, a lateral alignment offset of A is in a direction where the perpendicular extension sections move toward each other from a position in which the straight sections 140, 142 are substantially aligned. For the purpose of description of FIGS. 12-14, such a direction can be considered to be a negative direction.

FIG. 13 shows examples of coupling values for the example back-to-back C-shaped configuration of FIGS. 12A-12C as a function of lateral alignment offset (A), for different combinations of length (L) and width (W). FIG. 14 shows examples of directivity values for the same configuration of FIGS. 12A-12C as a function of lateral alignment offset (A), for the same combinations of length (L) and width (W).

Referring to FIG. 13, it is noted that coupling performance is optimal when lateral alignment offset (A) is approximately 0, and degrades as the offset increases in either of positive and negative directions. For a given length (L), the wider example (W=80 µm) has better coupling performance in general than the narrower example (W=60 µm). For example, the curve for W=80 µm and L=1,200 µm is generally higher than the curve for W=60 µm and L=1,200 µm. Similarly, the curve for W=80 µm and L=1,000 µm is generally higher than the curve for W=60 µm and L=1,000 µm.

For a given width (W), the longer example (L=1,200 µm) has better coupling performance in general than the shorter example (L=1,000 µm). For example, the curve for W=80 µm and L=1,200 µm is generally higher than the curve for W=80 µm and L=1,000 µm. Similarly, the curve for W=60 µm and L=1,200 µm is generally higher than the curve for W=60 µm and L=1,000 µm.

Referring to FIG. 14, it is noted that directivity performance generally increases when lateral alignment offset (A) is increased in a positive direction. For a given length (L), the narrower example (W=60 µm) has better directivity performance in general than the wider example (W=80 µm). For example, the curve for W=60 µm and L=1,200 µm is generally higher than the curve for W=80 µm and L=1,200 µm. Similarly, the curve for W=60 µm and L=1,000 µm is generally higher than the curve for W=80 µm and L=1,000 µm.

For a given width (W), the longer example (L=1,200 µm) has better directivity performance in general than the shorter example (L=1,000 µm). For example, the curve for W=80 µm and L=1,200 µm is generally higher than the curve for W=80 µm and L=1,000 µm. Similarly, the curve for W=60 µm and L=1,200 µm is generally higher than the curve for W=60 µm and L=1,000 µm.

Based on the foregoing examples related to FIGS. 12-14, one can see that improved and desirable coupling and/or directivity performance can be achieved by configuring a coupler based on one or more of design parameters such as coupler length, strip width, and lateral alignment offset between the driver and coupler arms. In some embodiments, one or more of such design parameters can be selected for given shapes of the driver and coupler arms (e.g., C-shaped arms).

Figure 15:
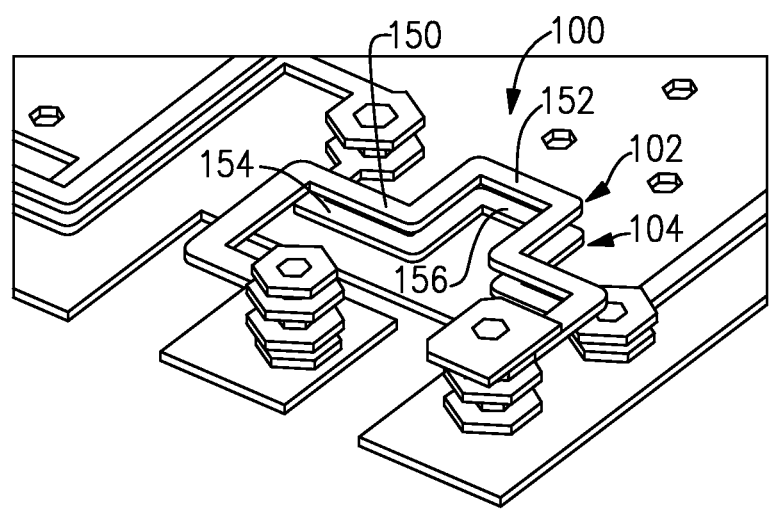
FIG. 15 shows an example of arm shapes that can be implemented as a variation of the C-shaped configuration.

FIGS. 15-19 show examples related arm shapes that can be implemented as variations of the C-shaped example of FIGS. 12-14. In FIG. 15, a coupler 100 is shown to include a driver arm 102 and a coupler arm 104 that can be separated by, for example, a laminate layer or some other insulator layer. The driver arm 102 can be implemented in a C-shape that is similar to the example of FIGS. 12-14, but with a section 152 that is offset from a straight section 150 of the C-shape. Such an offset section is shown to be on the outer side of the C-shape of the driver arm 102.

In the example of FIG. 15, the coupler arm 104 is shown to be implemented in a partial C-shape that is arranged with respect to the driver arm 102 similar to the example of FIGS. 12-14. However, one of the two extension sections that define the C-shape along with the straight section 154 is not present for the trace on the same level. The coupler arm 104 is also shown to include a section 156 that is offset from the straight section 154 similar to that of the driver arm 102, such that the straight section/offset section combination (150/152) of the driver arm 102 generally overlaps with the straight section/offset section combination (154/156) of the coupler arm 104. In the coupler arm 104, however, the offset section 156 is shown to be on the inner side of the partial C-shape of the coupler arm 104.

Figure 16:
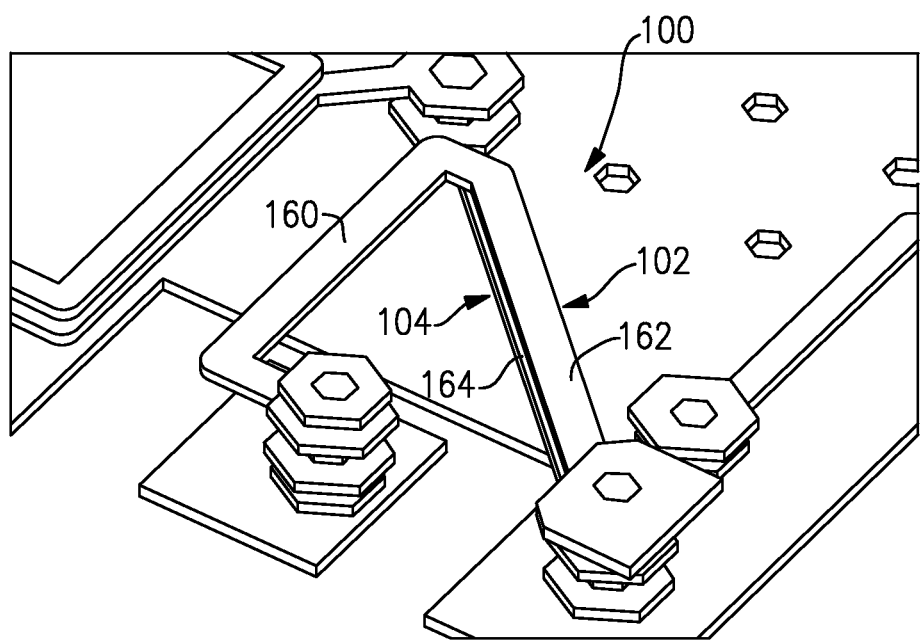
FIG. 16 shows another example of arm shapes that can be implemented as a variation of the C-shaped configuration.

In FIG. 16, a coupler 100 is shown to include a driver arm 102 and a coupler arm 104 that can be separated by, for example, a laminate layer or some other insulator layer. The driver arm 102 can be implemented in a shape that is similar to a number "7", such that an upper straight section 160 is joined with a diagonal straight section 102. The coupler arm 104 is shown to include a straight section 164 that is dimensioned and arranged to be generally below the diagonal straight section 162 of the driver arm 102.

Figure 17:
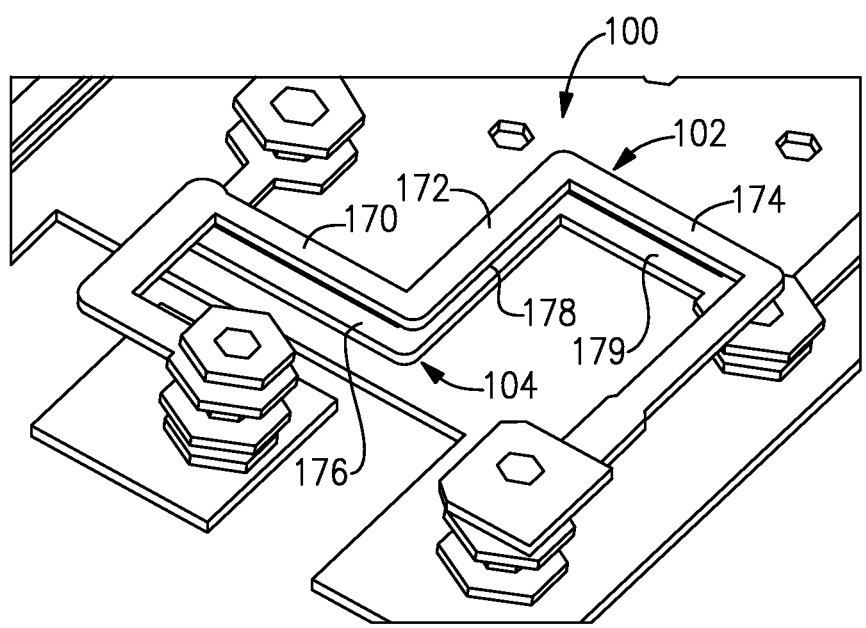
FIG. 17 shows yet another example of arm shapes that can be implemented as a variation of the C-shaped configuration.

In the example of FIG. 15, the offset sections 152, 156 of the driver and coupler arms 102, 104 can be positioned at about mid-portions of their respective straight sections 150, 152. Lengths of such offset sections can be about a third of the lengths of the straight sections. FIG. 17 shows an example where such offset sections can be relatively longer, and also be positioned on one side of their respective straight sections.

In FIG. 17, a coupler 100 is shown to include a driver arm 102 and a coupler arm 104 that can be separated by, for example, a laminate layer or some other insulator layer. A straight section 170 is shown to be joined to one end of an offset section 174 through a perpendicular section 172. The other end of the offset section 174 is shown to be joined to a terminal through another perpendicular section.

In the example of FIG. 17, the coupler arm 104 is shown to be implemented in a shape that is arranged with respect to the driver arm 102. More particularly, a straight section 176, a perpendicular section 178, and an offset section 179 can be positioned below their respective sections 170, 172, 174 of the driver arm 102. One end of the offset section 179 is shown to be connected to a terminal.

Figure 18:
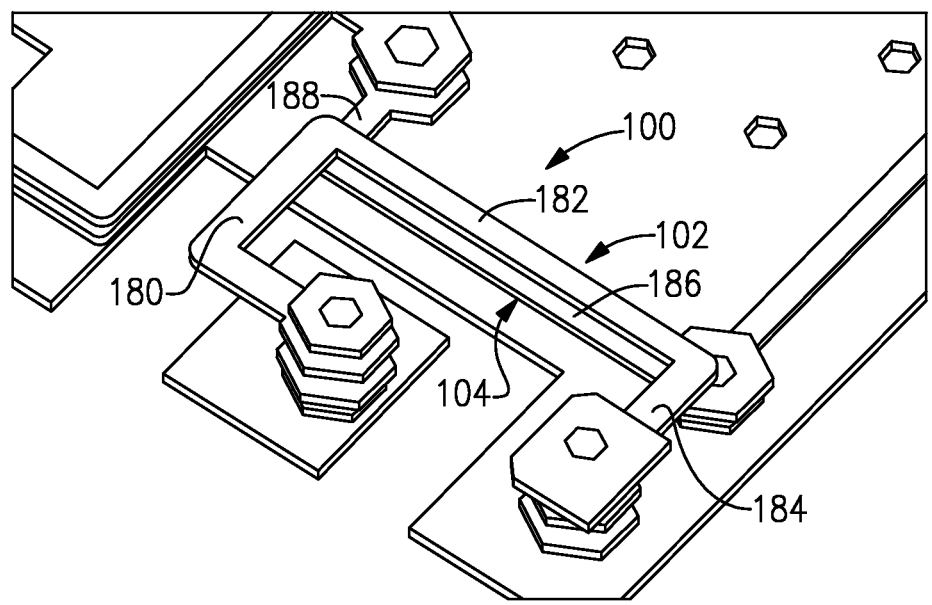
FIG. 18 shows yet another example of arm shapes that can be implemented as a variation of the C-shaped configuration.

In FIG. 18, a coupler 100 is shown to include a driver arm 102 and a coupler arm 104 that can be separated by, for example, a laminate layer or some other insulator layer. The driver arm 102 can be implemented in a C-shape that is similar to the example of FIGS. 12A-12C. More particularly, a straight section 182 and extension sections 180, 184 on both ends of the straight section 182 are shown to form the C-shape. In the example of FIG. 18, the extension section 184 is shown to be connected to a terminal, and the extension 180 is shown to be connected to another terminal through a section that extends generally parallel with the straight section 182.

In the example of FIG. 18, the coupler arm 104 is shown to be implemented in a partial C-shape that is arranged with respect to the driver arm 102. More particularly, a straight section 186 is shown to be positioned below the straight section 182 of the driver arm 102. One end of the straight section 186 is shown to be connected to a terminal, and the other end of the straight section 186 is shown to be connected to another terminal through an extension section 188.

Figure 19:
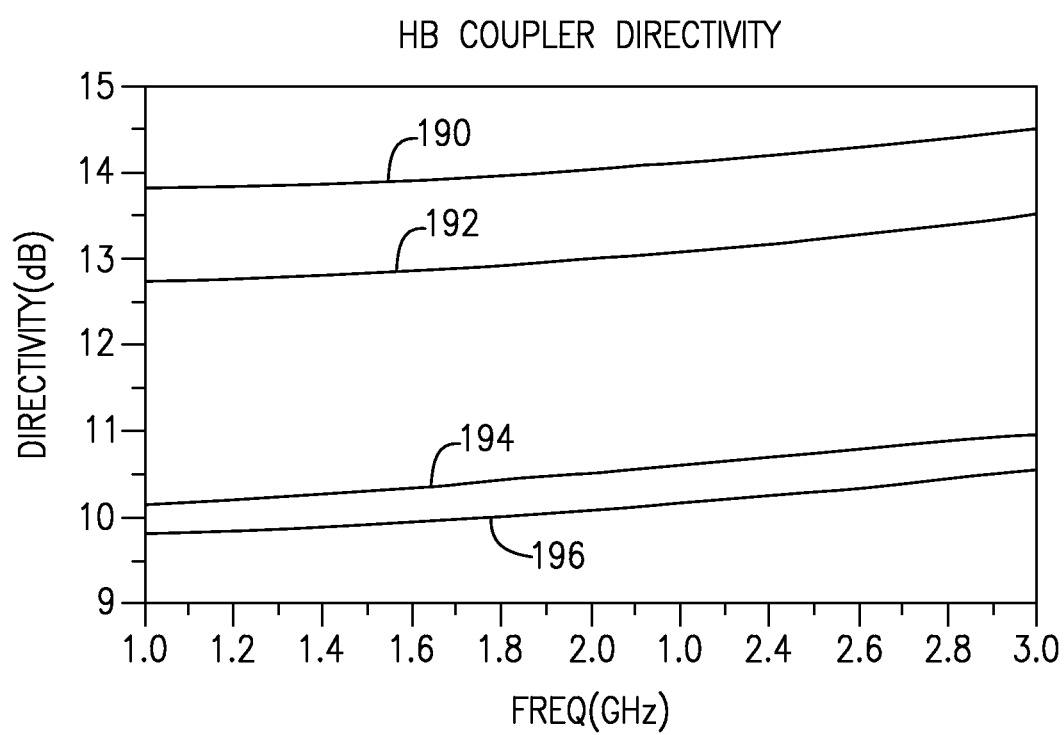
FIG. 19 shows directivity curves as a function of frequency for the example couplers of FIGS. 15-18.

FIG. 19 shows directivity curves as a function of frequency for the example couplers described in reference to FIGS. 15-18. Curve 190 corresponds to the coupler 100 of FIG. 18, curve 192 corresponds to the coupler 100 of FIG. 16, curve 194 corresponds to the coupler 100 of FIG. 17, and curve 196 corresponds to the coupler 100 of FIG. 15.

Referring to FIGS. 15-19, it is noted that couplers having relatively simpler C-shapes or variations thereof yield better directivity performance than those having more complex shapes. For example, the example couplers 100 of FIGS. 18 and 16 have relatively simple shapes (e.g., the overlapping portions between the driver and coupling arms are straight sections without offset sections), and also yield significantly higher directivity levels than those of FIGS. 15 and 17.

It is further noted that the example C-shaped coupler configuration of FIGS. 12A-12C can also be considered to have a relatively simple shape. Accordingly, and as shown in the example directivity plots of FIG. 14, such a C-shaped coupler configuration can yield directivity values of about 15 dB or higher with appropriate strip dimensions (e.g., 60 μm width, and length of 1,000 or 1,200 μm).

FIG. 20 shows that in some embodiments, input and/or output traces associated with a coupler or a group of couplers can be dimensioned to achieve desired directivity values. In the example of FIG. 20, a layout configuration 200 is shown to include a coupler assembly 110. Such a coupler assembly can be provided with an input trace (CPL_in) 202 and an output trace (CPL_out) 204 to allow, for example, a control loop involving the coupler assembly 110.

FIG. 20 further shows that width of either or both of the input and output traces (W_in, W_out) can be selected to vary, for example, directivity values associated with the coupler assembly 110. It will be understood that the input and/or output traces can also be varied in other manners to vary performance parameters.

FIG. 21 shows a layout configuration 200 that can be a more specific example of the layout 200 of FIG. 20. In the example of FIG. 21, a coupler assembly is shown to include a first coupler 100a and a second coupler 100b connected in a chain configuration. The first coupler 100a can be configured as a low-band (LB), and the second coupler 100b can be configured as a high-band (HB) coupler. It is noted that the particular example of the second coupler 100b is similar to the example described herein in reference to FIG. 16; however, it will be understood that other configurations can be utilized for the second coupler 100b (and/or the first coupler 100a).

In the example of FIG. 21, an input trace 202 is shown to provide an input path on a substrate layer. Similarly, an output trace 204 is shown to provide an output path on the substrate layer.

Referring to FIGS. 20 and 21, widths of the input and output traces 202, 204 can be varied to yield different directivity values. Table 1 lists example widths of the input and output traces, and resulting directivity values for the first and second couplers (100a, 100b).

TABLE 1

| CPL_in width (μm) | CPL_out width (μm) | Directivity D of HB coupler (100b in FIG. 21) (dB@1.9 GHz) | Directivity D of LB coupler (100a in FIG. 21) (dB@1.9 GHz) |
| --- | --- | --- | --- |
| 60 | 60 | 14.76306 | 17.16095 |
| 60 | 80 | 14.78385 | 17.4695 |
| 60 | 100 | 14.82659 | 17.75281 |
| 60 | 120 | 14.87157 | 18.03266 |
| 60 | 140 | 14.78782 | 18.14788 |
| 60 | 160 | 14.74439 | 18.24034 |
| 80 | 60 | 14.56892 | 17.2613 |
| 80 | 80 | 14.63124 | 17.4288 |
| 80 | 100 | 14.70594 | 17.76027 |
| 80 | 120 | 14.71349 | 17.94494 |
| 80 | 140 | 14.63788 | 18.13349 |
| 80 | 160 | 14.56451 | 18.21632 |
| 100 | 60 | 14.60863 | 17.14364 |
| 100 | 80 | 14.72178 | 17.50647 |
| 100 | 100 | 14.72579 | 17.56529 |
| 100 | 120 | 14.72165 | 17.95309 |
| 100 | 140 | 14.53930 | 17.96083 |
| 100 | 160 | 14.48204 | 18.28411 |
| 120 | 60 | 14.52584 | 17.12032 |
| 120 | 80 | 14.67376 | 17.43172 |
| 120 | 100 | 14.69399 | 17.66814 |
| 120 | 120 | 14.62379 | 17.92033 |
| 120 | 140 | 14.59446 | 17.95774 |
| 120 | 160 | 14.37779 | 18.18755 |
| 140 | 60 | 14.52359 | 17.28084 |
| 140 | 80 | 14.54188 | 17.61227 |
| 140 | 100 | 14.59730 | 17.82707 |
| 140 | 120 | 14.54334 | 17.83687 |
| 140 | 140 | 14.50716 | 18.1119 |
| 140 | 160 | 14.40882 | 18.16225 |

Referring to Table 1, it is noted that for the LB coupler (100a in FIG. 21), its directivity D can vary from a low value of 17.12 dB (120 μm and 60 μm in widths of input and output traces) to a high value of 18.28 dB (100 μm and 160 μm in widths of input and output traces) to yield an overall variation of about 1.2 dB. For the HB coupler (100b in FIG. 21), its directivity D can vary from a low value of 14.38 dB (120 μm and 160 μm in widths of input and output traces) to a high value of 14.87 dB (60 μm and 120 μm in widths of input and output traces) to yield an overall variation of about 0.5 dB.

Figure 23A:
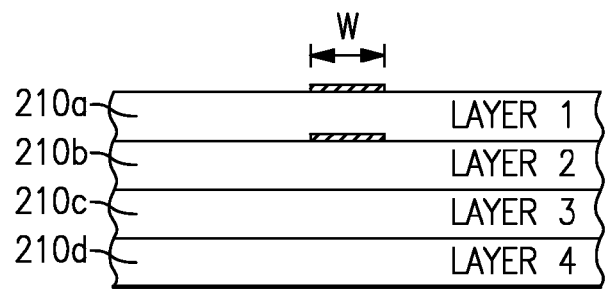
FIGS. 23A-23C show examples of how a coupler, such as the coupler of FIG. 22, can be positioned depth-wise within a multi-layer substrate.
Figure 23B:
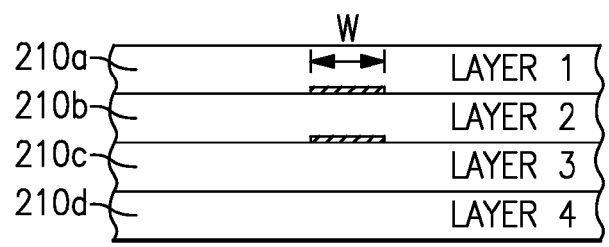
Figure 23C:
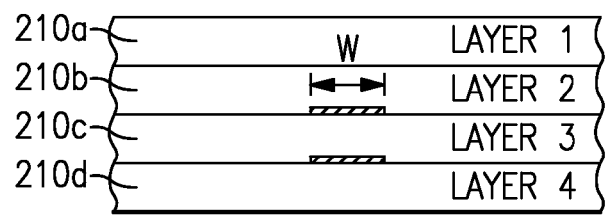
Figure 24:
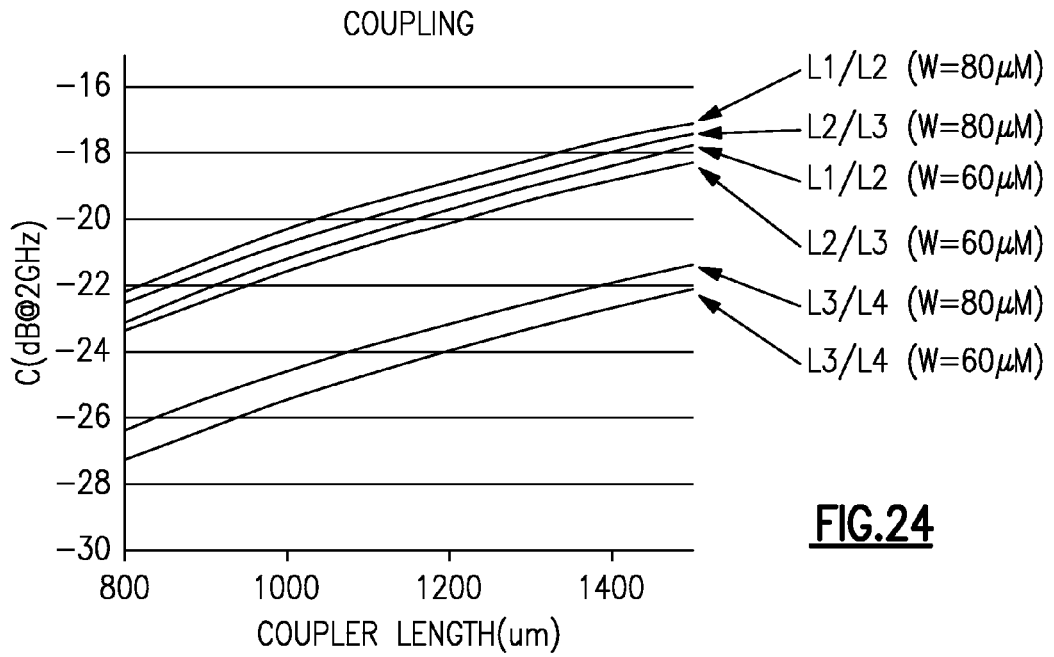
FIG. 24 shows various coupling plots for different combinations of coupler widths and coupler depth positions, as a function of coupler length.
Figure 25:
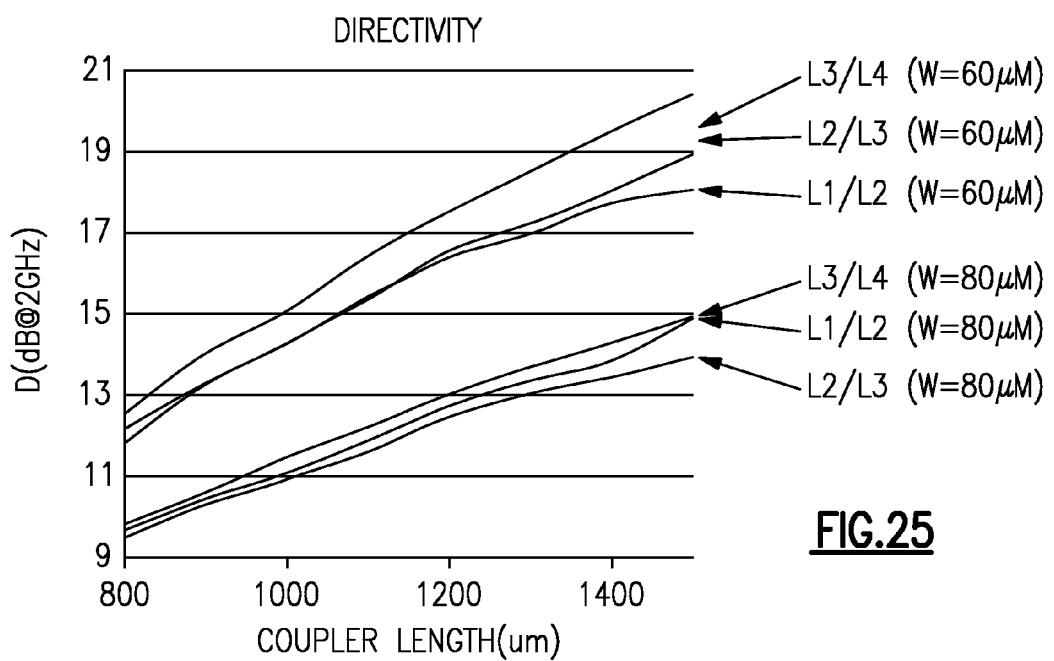
FIG. 25 shows various directivity plots for the same combinations as in FIG. 24, as a function of coupler length.

FIGS. 22-25 show that in some embodiments, widths of driver and coupler arms of a coupler, as well as depth position of such a coupler in a layer assembly, can impact, for example, coupling and directivity performance. For the purpose of description of FIGS. 22-25, a coupler 100 having a C-shaped configuration similar to the example of FIGS. 12A-12C is used, where the straight sections (140, 142 in FIGS. 12A-12C) generally overlap with no lateral offset. Referring to FIGS. 12A-12C and 22, each of the straight sections (140, 142 in FIGS. 12A-12C) has a length L and a width W. It is noted, and as described in reference to FIGS. 12-14, a C-shaped coupler having a longer length (of the straight section) provides better coupling performance and directivity performance than shorter version. FIGS. 24 and 25 show examples of how a width of the straight section can impact such coupler performance.

Figure 22:
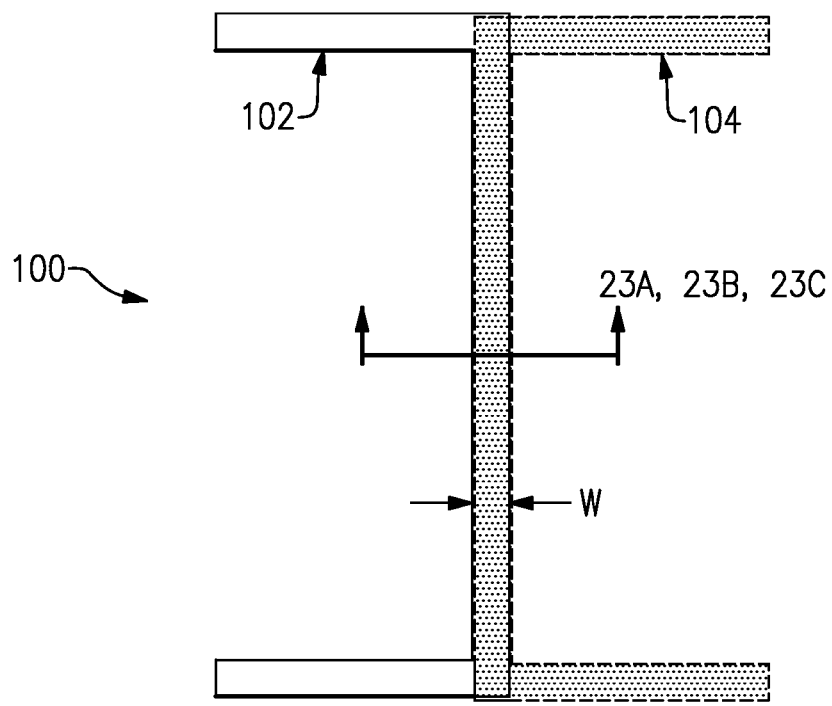
FIG. 22 shows a coupler having two C-shaped arms arranged in a back-to-back configuration, similar to the example of FIG. 12A.

FIGS. 23A-23C show examples of how the coupler 100 of FIG. 22 can be positioned depth-wise within a multi-layer substrate, and how such depth positions can impact coupling performance and directivity performance. A four-layer substrate structure is utilized for such a purpose; however, it will be understood that other numbers of layers can also be utilized.

In the example configuration of FIG. 23A, the driver arm 102 is implemented on the top layer (Layer 1) 210a, and the coupler arm 104 is implemented on the next lower layer (Layer 2) 210b. Accordingly, such a configuration is referred to as "L1/L2" in FIGS. 24 and 25. Similarly, and as shown in FIG. 23B, an "L2/L3" configuration involves the driver arm 102 on Layer 2 (210b) and the coupler arm 104 on Layer 3 (210c). Similarly, and as shown in FIG. 23C, an "L3/L4" configuration involves the driver arm 102 on Layer 3 (210c) and the coupler arm 104 on Layer 4 (210d).

FIG. 24 shows various coupling plots for different combinations of coupler widths and coupler depth positions, as a function of coupler length. FIG. 25 shows various directivity plots for the same combinations, also as a function of coupler length.

Referring to FIG. 24, it is noted that in general, coupling performance improves with coupler length. For two example coupler widths (W=60 μm and 80 μm), it is noted that the wider coupler (W=80 μm) generally has greater coupling than the narrower coupler (W=60 μm), for a given depth position. Among the three coupler depths (L1/L2, L2/L3 and L3/L4), it is noted that a shallower position yields greater coupling than a deeper position. More particularly, Coupling$_{L1/L2}$>Coupling$_{L2/L3}$>Coupling$_{L3/L4}$.

Referring to FIG. 25, it is noted that in general, directivity performance improves with coupler length. For two example coupler widths (W=60 μm and 80 μm), it is noted that the narrower coupler (W=60 μm) generally has significantly greater directivity than the wider coupler (W=80 μm), for a given depth position. Among the three coupler depths (L1/L2, L2/L3 and L3/L4), it is noted that in general, a deeper position yields greater directivity than a shallower position. More particularly, Directivity$_{L3/L4}$>Directivity$_{L2/L3}$>Directivity$_{L1/L2}$, for a given coupler width.

In the example of FIG. 25, it is noted that directivity does not seem to vary much between the shallow (L1/L2) and mid (L2/L3) depths. In fact, for the wider coupler (W=80 μm), directivity for the shallow depth (L1/L2) is shown to be slightly higher than that of the mid-depth (L2/L3) configuration. However, it is noted that the deep (L3/L4) configuration shows consistently higher directivity performance than the other depth configurations.

Referring to the examples of FIGS. 24 and 25, coupling and directivity performance can be adjusted by selecting an appropriate combination of some or all of design parameters such as coupler length, coupler width, and depth position of the coupler. Further, and as described herein, other design parameters such a coupler shape and input/output trace dimensions can also be considered when designing a coupler or a coupler assembly to yield desired performance parameters.

In some embodiments, a coupler or a coupler assembly having one or more features as described herein can be utilized to provide advantageous improvements in RF applications such as multi-band multi-mode (MBMM) front-end module (FEM) products. In such products, a chain coupler is commonly utilized as an important component; however, traditional coupler termination tuning generally does not work in such a chain coupler configuration.

In some embodiments, one or more features as described herein can be implemented in a chain coupler to improve performance such as directivity. For example, and as described herein, placing a coupler on lower layers (e.g., L3/L4 in FIGS. 22-25) can improve directivity by about 1 to 2 dB. In another example, configuring a coupler in a relatively simple C-shape or variation thereof (e.g., FIGS. 12, 16, 18) can improve directivity by about 3 to 4 dB. In yet another example, an offset of alignment between driver and coupler arms (e.g., FIGS. 12A-12C) can improve directivity by about 2 dB. In yet another example, configuring input and/or output traces (e.g., width adjustment in FIGS. 20 and 21) can improve directivity by about 1 dB. When some or all of the foregoing designs are implemented together, significant overall improvement in directivity can be realized.

Figure 26:
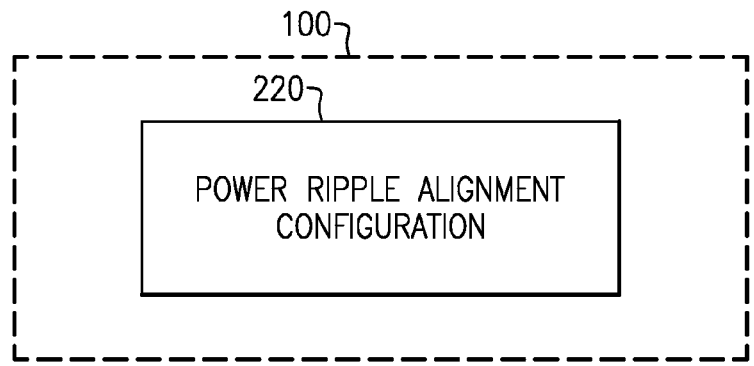
FIG. 26 shows that in some embodiments, a coupler can include a configuration for providing power ripple alignment to reduce error in power detection.

FIGS. 26-33 generally relate to coupler features that can be implemented to address power detection errors. FIG. 26 shows that in some embodiments, a coupler 100 can include a configuration 220 for providing power ripple alignment to, for example, reduce error in power detection.

It is noted that a power coupler is commonly utilized to detect and thus control output power of a PA. Accordingly, minimal or reduced power detection error is desirable. It is further noted that an ideal coupler typically involves very high directivity and very low return loss; however, it is generally not possible or practical to meet such ideal settings in a real front-end product design. For example, directivity of a coupler is difficult to improve in commonly used laminate technology.

In some embodiments, a coupler can be configured to yield acceptable directivity and return loss (e.g., as described herein), and power ripple phases at load side and at coupler output side can be aligned or moved toward such alignment. As described herein, such an alignment of phases can result in a significant reduction in power detection error. In some embodiments, such an alignment can be achieved by, for example, adjusting a phase delay between the load and the coupler output. Such a phase delay can be achieve by, for example, adjusting the shape and/or dimension of a trace associated with a coupler arm. Although various examples are described in the foregoing contexts, it will be understood that one or more features of the present disclosure can also be implemented with other configurations.

It is further noted that an RF output return loss can also be an important design factor. For example, a −20 dB return loss with perfect directivity can still cause a power error of 0.5 dB unmet in some designs.

It is further noted that in some designs, power detection error can be reduced or minimized by improving coupler directivity. However, a coupler's directivity can only be improved to a limited extent due to, for example, module size and technology being utilized.

In some embodiments, a coupler can be configured so that power ripples at the load side of a driver arm and the output side of a coupler arm are moved relative to each other to yield a desired reduction in power detection error. Such movement of the power ripples can include, for example, adjusting phase(s) of either or both of the power ripples to substantially align, or move toward alignment of, the two phases.

Figure 27:
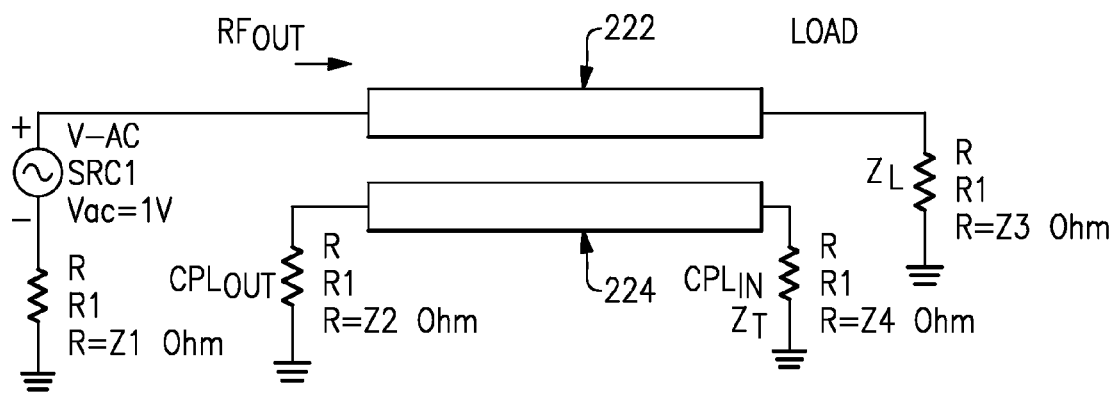
FIG. 27 shows an example coupler depicted in an impedance representation to demonstrate where power ripples can occur.

FIG. 27 shows an example coupler depicted in an impedance representation to demonstrate where the foregoing power ripples can occur, and how such power ripples can be adjusted as described herein. A driver arm is indicated as 222, and a coupler arm is depicted as 224. The input side of the driver arm 222 is shown to receive an RF signal (RFout) from, for example, an output of a power amplifier. The output side of the driver arm 222 can be connected to a load, and therefore is indicated as the Load side. The Load side is shown to be presented with a load impedance $Z_L$.

In the example of FIG. 27, the input side of the coupler arm 224 is indicated as CPLin, and the output side is indicated as CPLout. The coupler arm 224 is shown to present an impedance of $Z_T$.

Referring to FIG. 27, it is noted that when $Z_T$ is 50 Ohms and $Z_L$ is not, the power at the load side of the driver arm (Load) can be represented as $$P_{Lpk} = 20\log\left[\frac{1 + |\Gamma_L s_{33}|}{1 - |\Gamma_L s_{33}|}\right]. \quad (1)$$

The power at the output side of the coupler (CPLout) can be represented as $$P_{Cpk} = 20\log\left[\frac{1 + K}{1 - K}\right], \quad (2)$$

where K can be represented as $$K = \left|\frac{\Gamma_L s_{31}/D}{1 - \Gamma_L s_{33}}\right|. \quad (3)$$

In Equations 1-3 and FIG. 27, the input of driver arm 222 can be port 1, the output of the driver arm 222 (Load) can be port 2, the output of the coupler arm 224 (CPLout) can be port 3, and the input of the coupler arm 224 (CPLin) can be port 4. Accordingly, $\Gamma_L$ (or $s_{22}$) represents reflection coefficient at the Load port and can be associated with voltage standing wave ratio (VSWR), $s_{33}$ is representative of RF return loss, $s_{31}$ represents coupling ratio, and D represents directivity.

Figure 28:
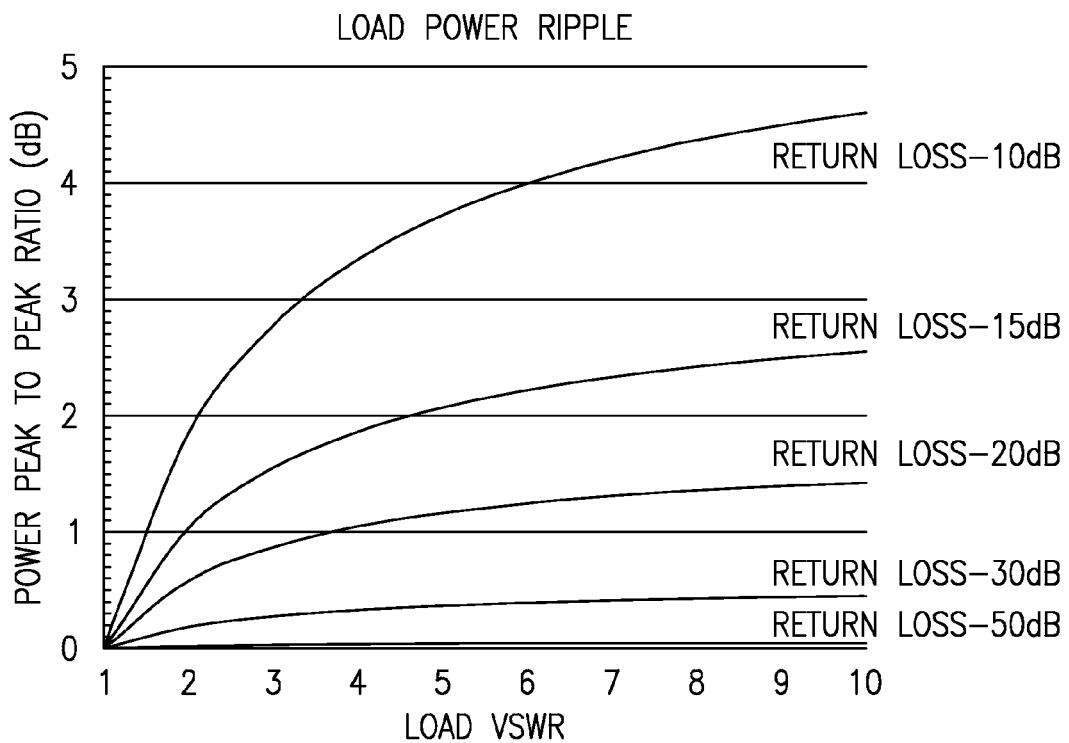
FIG. 28 shows various $P_{Lpk}$ plots as a function of VSWR, showing possible magnitudes of load power ripple.

FIG. 28 shows various $P_{Lpk}$ plots as a function of VSWR, showing possible magnitudes of load power ripple. Such $P_{Lpk}$ plots are shown for different values of return loss.

Figure 29:
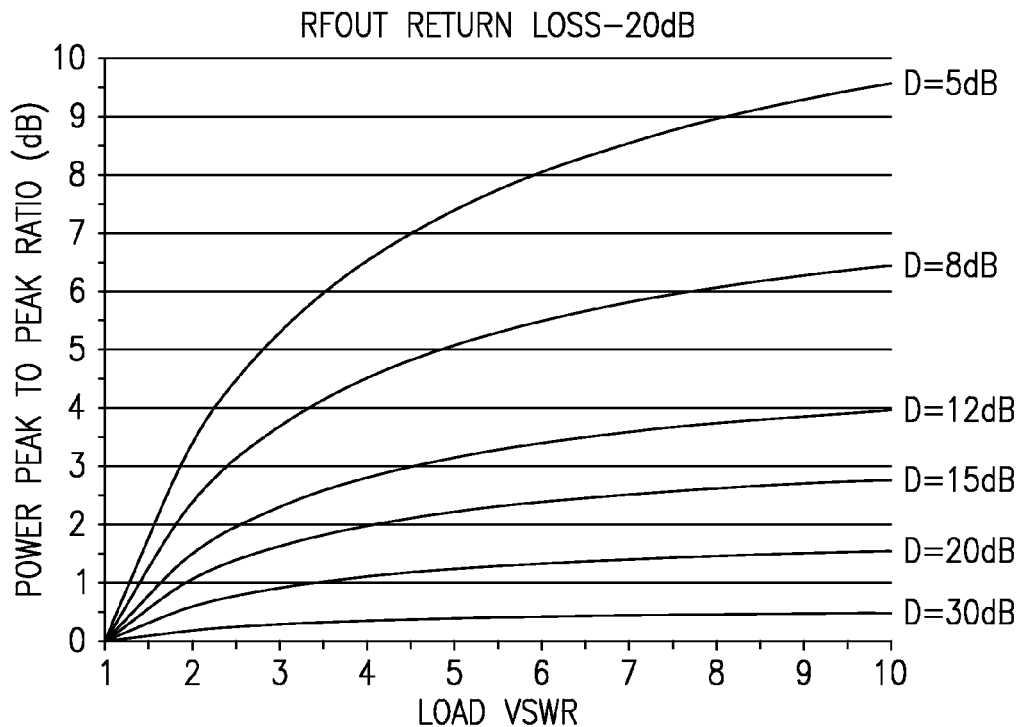
FIG. 29 shows various $P_{Cpk}$ plots as a function of VSWR, showing possible magnitudes of load power ripple.

FIG. 29 shows various $P_{Cpk}$ plots as a function of VSWR, showing possible magnitudes of coupler side power ripple. Such $P_{Cpk}$ plots are obtained at a given return loss value of −20 dB, and for various directivity values as shown.

As described herein in reference to FIGS. 27-29 and Equations 1-3, it is noted that the power ripple on the Load side can be affected by the load VSWR and RF return loss, and the power ripple on the coupler output side can be affected by the load VSWR, RF return loss, and directivity.

Figure 30:
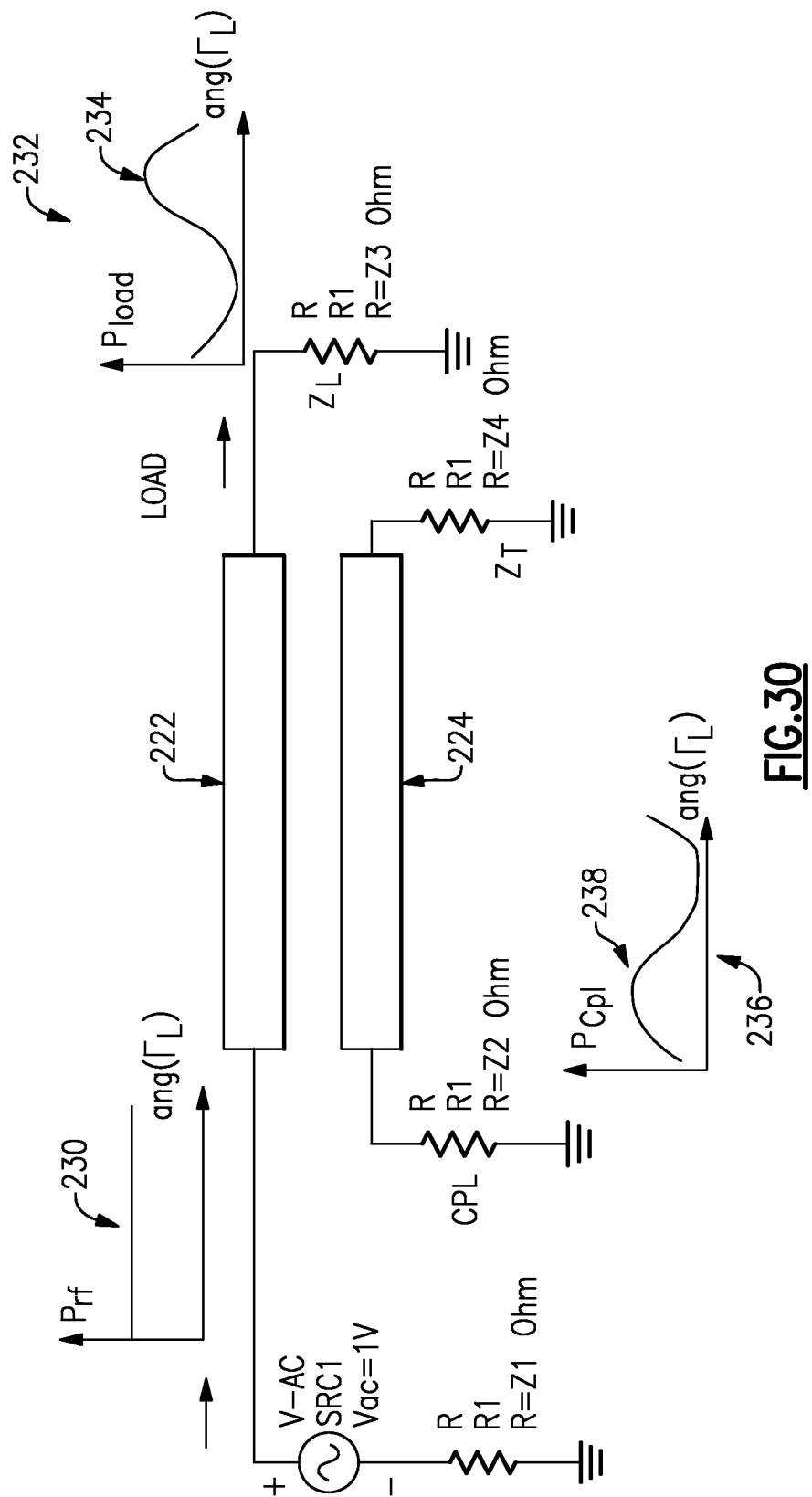
FIG. 30 is similar to the example coupler configuration of FIG. 27, and further includes example power ripples at the load side of a driver arm and at the output side of a coupler arm.

FIG. 30 is similar to the example coupler configuration of FIG. 27, but also depicts example power ripples at the Load side of the driver arm 222 and at the output side of the coupler arm 224. More particularly, such power ripples can result when, for example, a uniform peak power is provided at the input side of the driver arm 222. Such a uniform input peak power distribution is indicated as 230, and the resulting power ripple distributions at the Load side and the coupler output side are indicated as 232 and 238, respectively. Such power distributions are shown as a function of phase angle of the reflection coefficient (ang($\Gamma_L$)).

In the example of FIG. 30, the power ripple distribution on the Load side (PLoad) is shown to include a peak 234. Similarly, the power ripple distribution on the coupler output side (PCpl) is shown to include a peak 238. Such power ripple peaks are shown to be not aligned in the example of FIG. 30.

Referring to Equation 1, it is noted that at the peak 234 of PLoad (232), $\angle \Gamma_L s_{33}=0$. Referring to Equations 2 and 3, it is noted that at the peak 238 of PCpl (236), $\angle \Gamma_L s_{33}=0$ also. Further, $\angle \Gamma_L s_{31}D = \angle \Gamma_L s_{31}s_{21}/s_{23}=0$, such that a condition $\angle s_{31}s_{21}=\angle s_{33}s_{23}$ can apply.

As seen in the example of FIG. 30, the phase of the power ripple at Load side is generally not the same as that at the coupler output side in general. In such a situation, power detection error can be based on the difference of the two ripples.

Figure 31B:
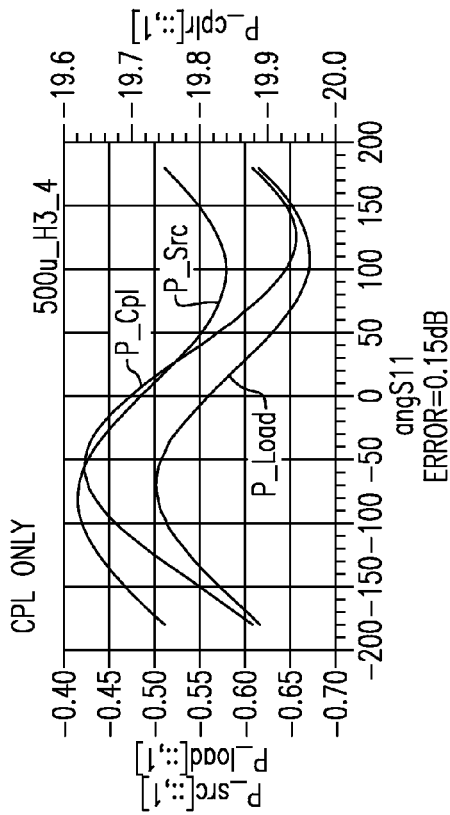
FIGS. 31A-31D show examples in which an adjustment can be made to the coupler arm to move the phase of the coupler output side power ripple relative to the phase of the load power ripple.
Figure 31D:
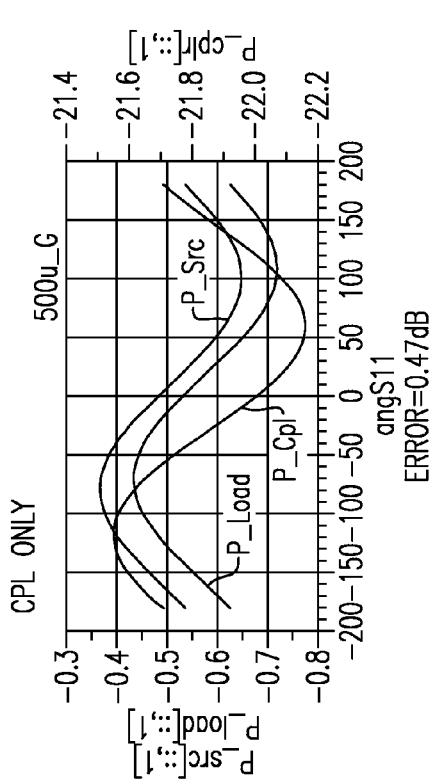

In some embodiments, one or more adjustments can be implemented in a coupler configuration to adjust the phase(s) of either or both of the power ripples at the Load and coupler output sides. FIGS. 31A-31D show examples in which an adjustment can be made to the coupler arm to move the phase of the coupler output side power ripple relative to the phase of the Load power ripple. FIGS. 32A-32C show examples in which adjustments can be made to both of the driver and coupler arms to move the phases of the corresponding power ripples relative to each other. It will be understood that an adjustment can be made to the driver arm to move the phase of the Load power ripple relative to the phase of the coupler output side power ripple.

In the examples of FIGS. 31A-31D, the driver arm is assumed to be fixed; accordingly, its power distribution on the Load side (P_Load) has a substantially same phase among the four examples when an input power (P_Src) is applied. P_Load is shown to have a slight phase difference relative to P_Src.

Figure 31A:
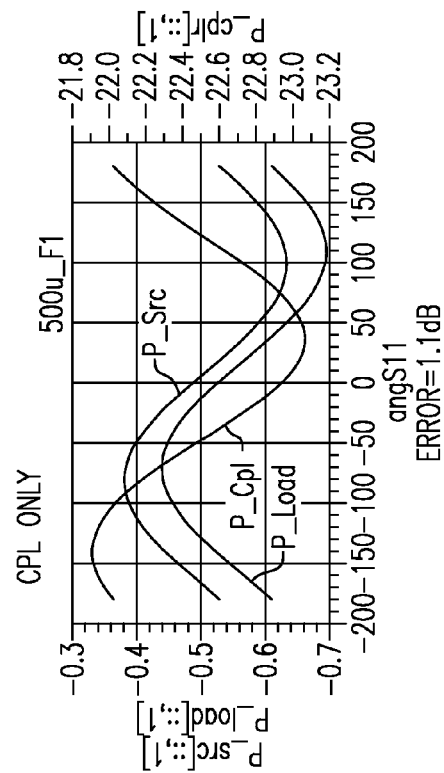
Figure 31C:
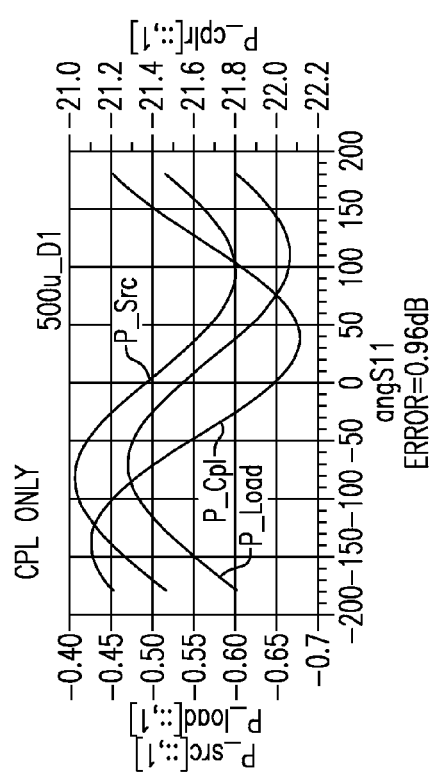
Figure 32A:
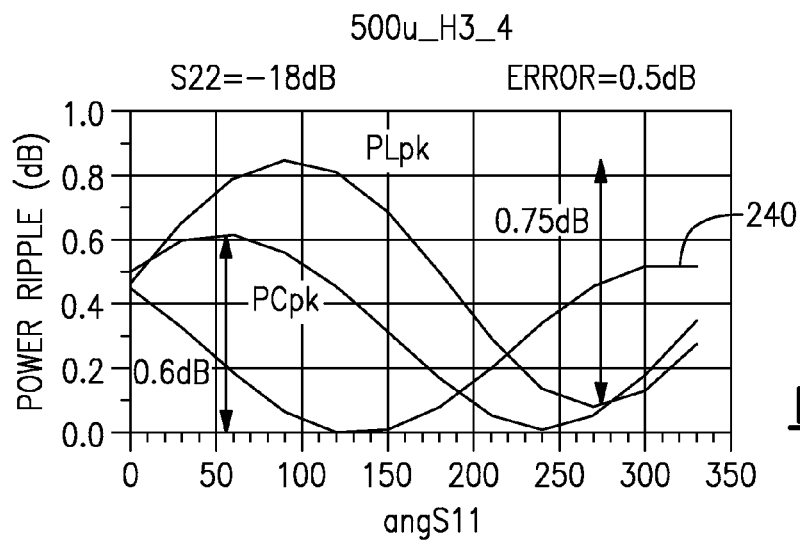
FIGS. 32A-32C show examples in which adjustments can be made to both of the driver and coupler arms to move the phases of the corresponding power ripples relative to each other.
Figure 32B:
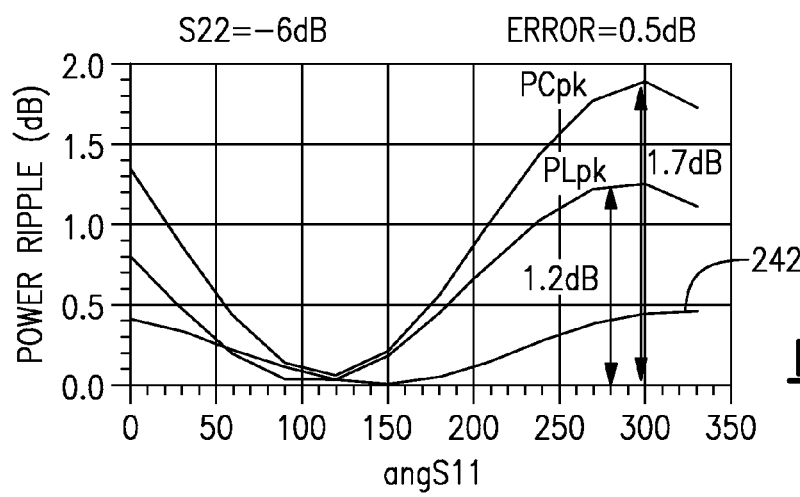
Figure 32C:
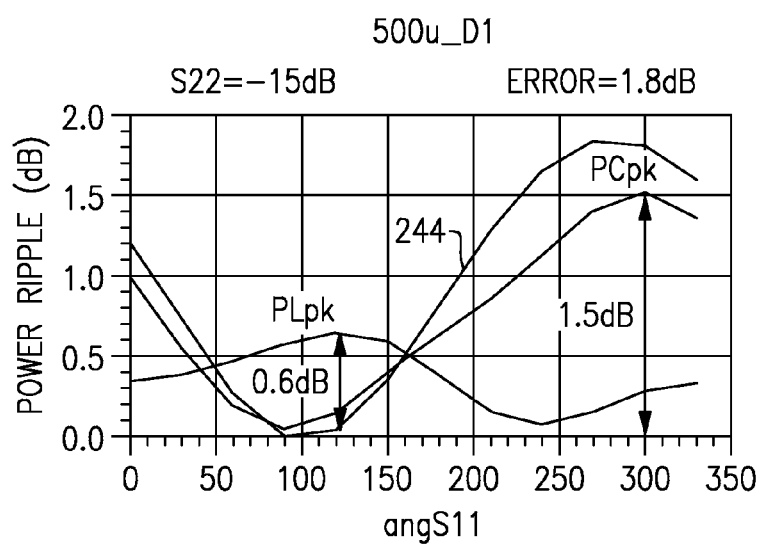

FIG. 31A shows an example of a coupler (output side) power distribution (P_cplr) that has the greatest phase difference (among the four examples of FIGS. 31A-31D) relative to the phase of P_Load. Accordingly, the resulting power detection error of 1.1 dB is the worst among the four examples. FIG. 31C shows an example in which the phase difference between P_cplr and P_load is less than that of the example of FIG. 31A. Accordingly, the resulting power detection error of 0.96 dB is less than that of the example of FIG. 31A. Similarly, FIG. 31D shows an example in which the phase difference between P_cplr and P_load is less than that of the example of FIG. 31D. Accordingly, the resulting power detection error of 0.47 dB is less than that of the example of FIG. 31D. Similarly, FIG. 31B shows an example in which the phase difference between P_cplr and P_load is the least among the four examples. Accordingly, the resulting power detection error of 0.15 dB is less than those of the examples of FIGS. 31A, 31C, 31D.

In the examples of FIGS. 32A-32C, both of the driver arm and the coupler arm can be adjusted to move the phases of the corresponding power ripples relative to each other. Power distributions for the Load (PLpk) and the coupler output (PCpk) are plotted along with corresponding power detection error distributions (240, 242, 244). Example amplitudes of PLpk and PCpk are also shown.

In the example of FIG. 32C, the phases of PLpk and PCpk differ greatly, by about 180 degrees. Accordingly, the resulting power detection error (244) can be as high as about 1.8 dB. In the examples of FIGS. 32A and 32B, the phase differences between PLpk and PCpk are much less than that of FIG. 32C. Accordingly, the resulting power detection errors (240, 242) are also less (about 0.5 dB or less).

Figure 33:
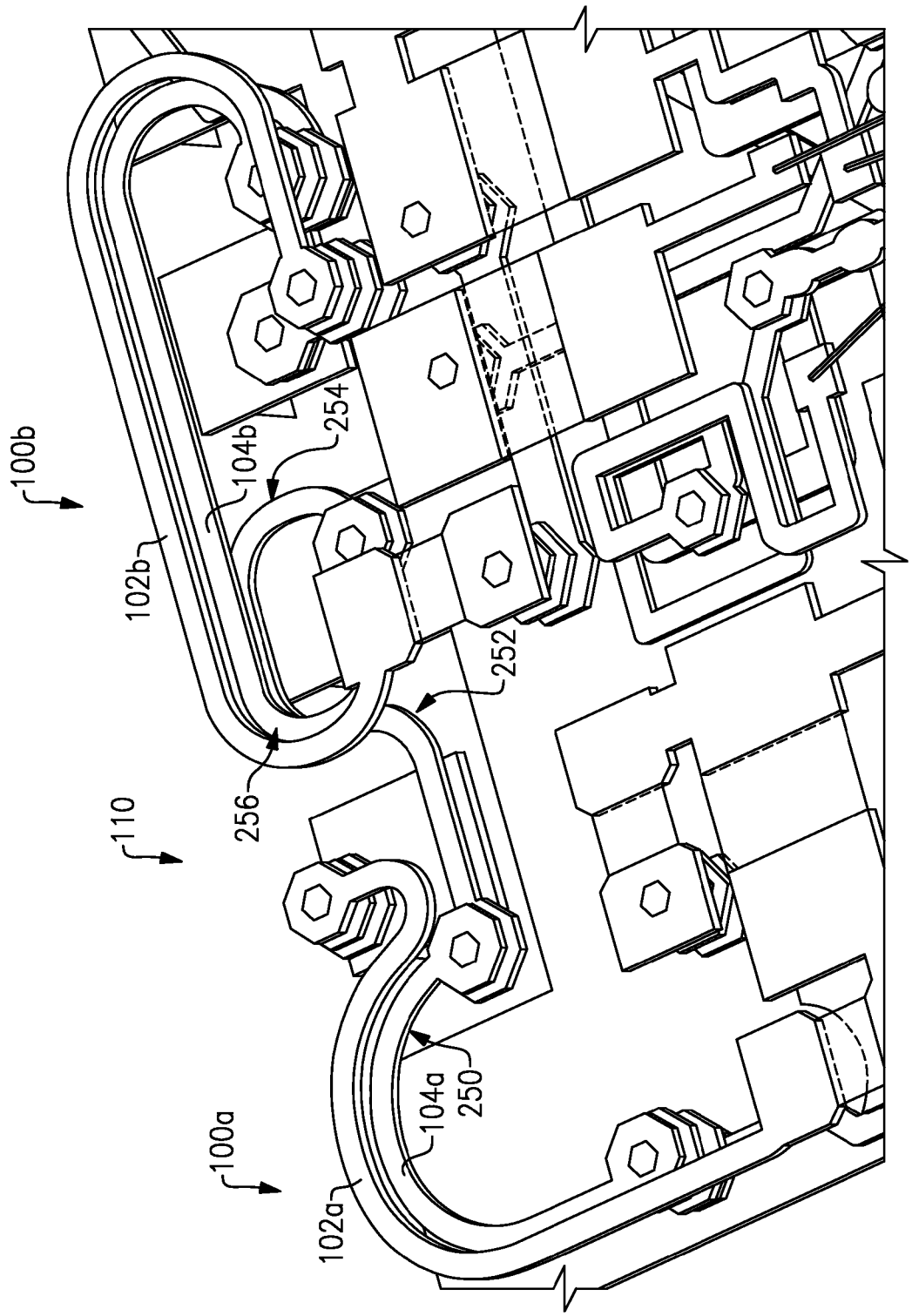
FIG. 33 shows an example of a coupler assembly having one or more phase shifting features to move the phase(s) of the one or more power ripples.

FIG. 33 shows an example of a coupler assembly 110 having a first coupler configuration 100a and a second coupler configuration 100b. The first coupler configuration 100a can be, for example, a high-band (HB) coupler, and the second coupler configuration 100b can be, or example a low-band (LB) coupler.

The first coupler configuration 110a is shown to include a driver arm 102a having a curved shape (e.g., a partial loop) between its terminals. The second first coupler configuration 110b is shown to include a driver arm 102b having a curved shape (e.g., a partial race-track shape) between its terminals.

The first coupler configuration 100a is shown to further include a coupler arm 104a having a curved shape (e.g., a partial loop) between its terminals, so as to provide an overlapping section with respect to the driver arm 102a to thereby facilitate the coupling functionality. The second coupler configuration 100b is shown to further include a coupler arm 104b having a curved shape (e.g., a partial race-track shape) between its terminals, so as to provide an overlapping section with respect to the driver arm 102b to thereby facilitate the coupling functionality.

In the example of FIG. 33, the coupler arm 104a of the first coupler 100a is shown to be connected to the coupler arm 104b of the second coupler 100b so as to form a chain coupler configuration.

FIG. 33 further shows that in some embodiments, one or more coupler arms of a chain coupler can be configured to provide phase offset(s) to thereby move the corresponding power ripple(s) relative to the corresponding power ripple(s) of the driver arm(s). As described herein, such phase offsets can reduce power detection errors.

In the example shown in FIG. 33, the coupler arm 104a is shown to include a curved feature (e.g., a partial loop) indicated as 250, implemented to provide a phase offset for its power ripple. Similarly, the coupler arm 104b is shown to have associated with it a plurality of features implemented to contribute to a phase offset for its power ripple. For example, a curved feature 252 between the first and second coupler arms 104a, 104b can be implemented to contribute to such a phase offset. Similarly, a complete loop 254 can be implemented to contribute to such a phase offset. Similarly, a curved feature (e.g., a partial loop) 256 can be implemented to contribute to such a phase offset.

In the example of FIG. 33, it is noted that a feature implemented to provide phase offset can be a part of an arm (e.g., a coupler arm) at a portion that overlaps with the other arm (e.g., a driver arm), a part of an arm that does not overlap with the other arm, or any combination thereof. It is further noted that while the examples in FIG. 33 show phase offsets being introduced with features of the coupler arms, it will be understood that similar phase offsets can be introduced with features associated with one or more driver arms.

As described herein, a coupler's power detection error can arise from power ripples associated with the load side and the coupler output side. It is noted that when directivity of the coupler is very high, the power detection error can be mainly from the load power ripple. When directivity is very low, the power detection error can be mainly from the coupler output power ripple.

In some embodiments, a coupler can be designed with good directivity by considering important contributors such as mutual coupling inductance. As described herein, such a coupler can also be configured so as to align, or have closer alignment, of load and coupler output power ripples, so as to obtain a reduction in power detection error.

In the various examples described herein, various coupler design parameters such as coupler-related length, coupler-related width, coupler-related lateral offset, and coupler-related depth position are discussed. For the purpose of description, it will be understood that a coupler having one or more features as described herein can have a length that is, for example, between 0.6 mm and 2.0 mm, between 0.8 mm and 1.6 mm, or between 1.0 mm and 1.4 mm. In some embodiments, such a length can be greater than, for example, 0.8 mm, 1.0 mm, 1.1 mm, 1.2 mm, 1.3 mm, or 1.4 mm.

For the purpose of description, it will be understood that a coupler having one or more features as described herein can have a width that is, for example, between 40 μm and 200 μm, between 50 μm and 160 μm, between 50 μm and 120 μm, between 50 μm and 100 μm, or between 50 μm and 80 μm. In some embodiments, such a width can be less than or equal to, for example, 160 μm, 120 μm, 100 μm, 80 μm, or 60 μm.

For the purpose of description, it will be understood that a coupler having one or more features as described herein can have a lateral offset magnitude that is, for example, between 0 μm and 60 μm, between 0 μm and 50 μm, between 0 μm and 40 μm, between 0 μm and 30 μm, or between 0 μm and 20 μm. In some embodiments, such a lateral offset magnitude can be greater than, for example, 0 μm, 5 μm, 10 μm, 15 μm, or 20 μm.

Figure 34:
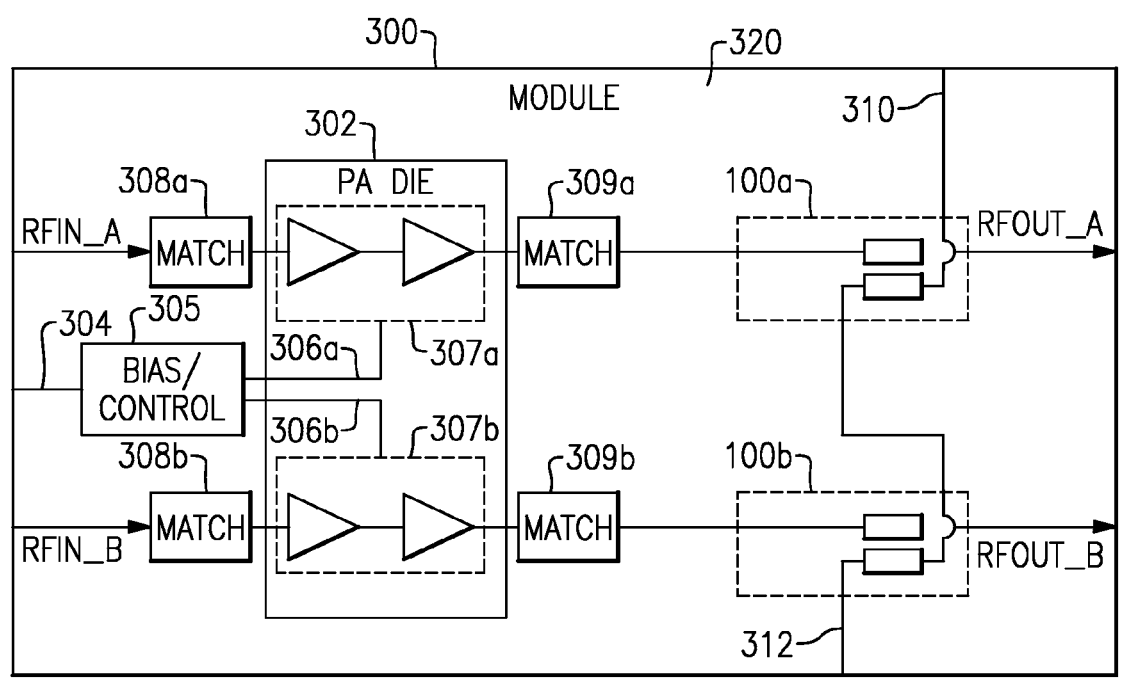
FIG. 34 depicts an example module having one or more features as described herein.

In some implementations, one or more features described herein can be included in a module. FIG. 34 depicts an example module 300 that includes a power amplifier (PA) die 302 having a plurality of PAs 307a, 307b. By way of examples, first and second PAs 307a, 307b are shown to receive and amplify input RF signals (RFIN_A, RFIN_B). Such amplified RF signals can be passed through respective output matching circuits 309a, 309b, and be routed to respective outputs RFOUT_A, RFOUT_B.

The PAs 307a, 307b are shown to be in communication with a bias/control circuit 305 (lines 306a, 306b). The bias/control circuit 305 can be configured to provide bias and/or control functionality for the PAs 307a, 307b based on, for example, a control signal input 304. In some embodiments, the bias/control circuit 305 can be implemented in a die that is separate from the PA die 302. In some embodiments, the bias/control circuit 305 can be implemented in the same die as the PA die 302.

An output of the first matching network 309a is shown to be connected to a first coupler 100a. Similarly, an output of the second matching network 309b is shown to be connected to a second coupler 100b. Either or both of the couplers 100a, 100b can include one or more features as described herein.

In the example shown, the first and second couplers 100a, 100b are shown to be daisy-chained together between a coupler input 310 and an output 312. It will be understood that such couplers may or may not be chained together as shown.

In the example module 300 of FIG. 34, various components described herein can be provided or formed on or within a packaging substrate 320. In some embodiments, the packaging substrate 320 can include a laminate substrate. In some embodiments, the module 300 can also include one or more packaging structures to, for example, provide protection and facilitate easier handling of the module 300. Such a packaging structure can include an overmold formed over the packaging substrate 320 and dimensioned to substantially encapsulate the various circuits and components thereon.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 35A:
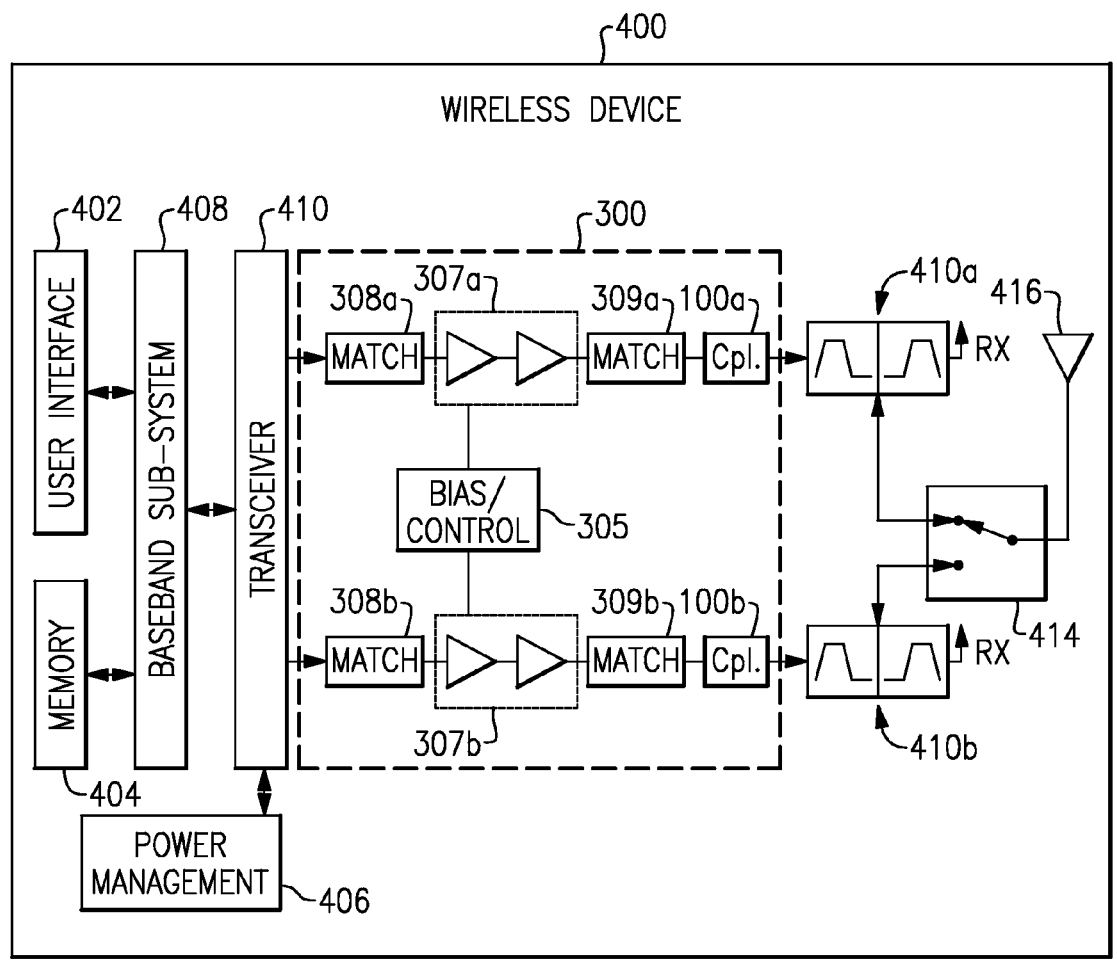
FIGS. 35A and 35B show examples of wireless devices having one or more features as described herein.
Figure 35B:
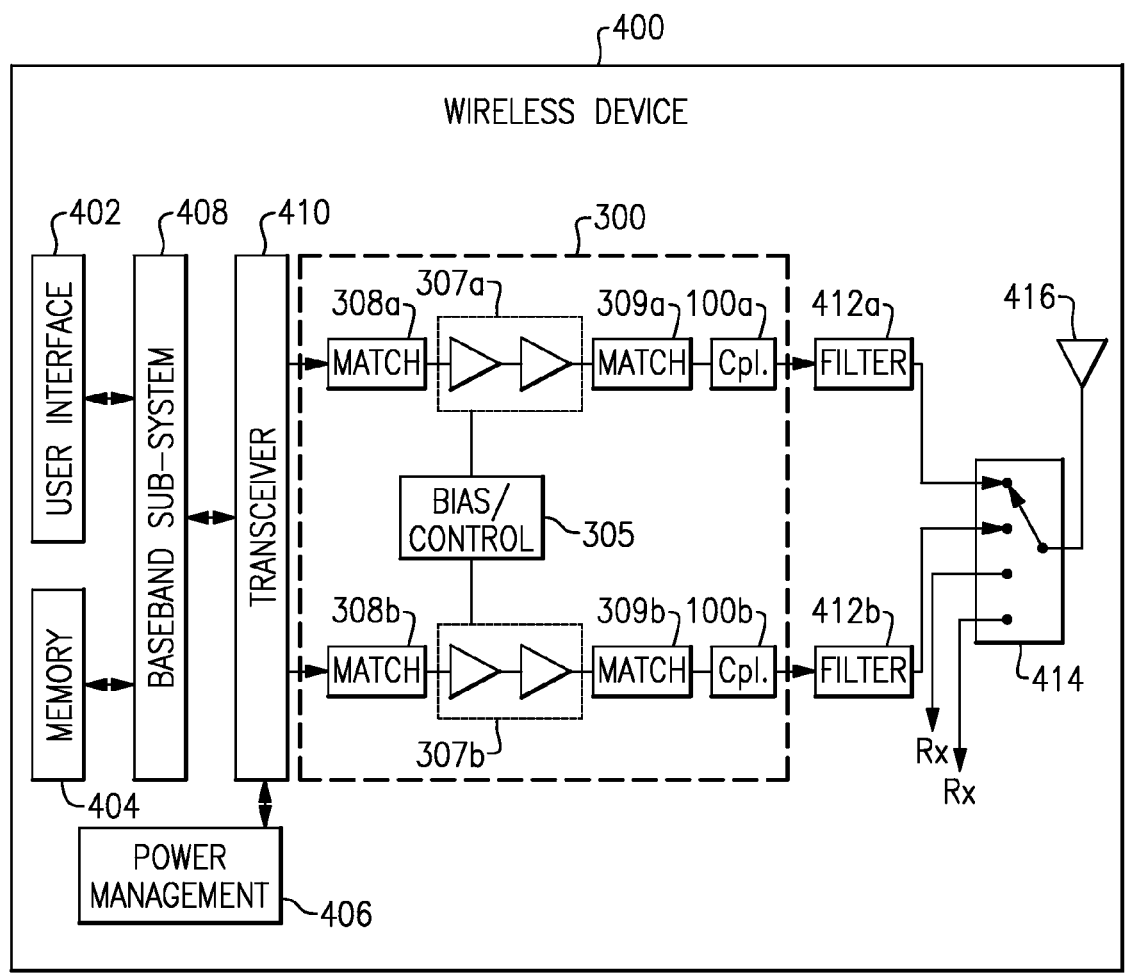

FIGS. 35A and 35B schematically depict an example wireless device 400 having one or more advantageous features described herein. The example shown in FIG. 35A is for a frequency-division duplexing (FDD) configuration, and the example shown in FIG. 35B is for a time-division duplexing (TDD) configuration.

In each of the two example wireless devices of FIGS. 35A and 35B, PAs 307, their input and output matching circuits (309), and coupling circuits 100 can be implemented on a module 300 as described in FIG. 34. The PAs 307 can receive their respective RF signals from a transceiver 410 that can be configured and operated in known manners. The transceiver 410 can be configured to generate the RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400 of FIG. 35A, outputs of the module 300 are shown to be routed to an antenna 416 via their respective duplexers 410a, 410b and a band-selection switch 414. The band-selection switch 414 can include, for example, a single-pole-double-throw (e.g., SPDT) switch to allow selection of an operating band. Although depicted in the context of the two-band output of the module 300, it will be understood that the number of operating bands can be different. In configurations where multiple bands are involved, such a band-selection switch can have, for example, an SPMT (single-pole-multiple-throw) configuration.

In the example of FIG. 35A, each duplexer 410 can allow transmit and receive operations to be performed substantially simultaneously using a common antenna (e.g., 416). In FIG. 35A, received signals are shown to be routed to "Rx" paths (not shown) that can include, for example, a low-noise amplifier (LNA).

In the example wireless device 400 of FIG. 35B, time-division duplexing (TDD) functionality can be facilitated by filters 412a, 412b connected to the two example outputs of the module 300. The paths out of the filters 412a, 412b are shown to be connected to an antenna 416 through a switch 414. In such a TDD configuration, Rx path(s) can come out of the switch 414. Thus, the switch 414 can act as band selector (e.g., between high-band and low-band as described herein), as well as a Tx/Rx (TR) switch.

In the example wireless devices 400 depicted in FIGS. 35A and 35B, the example module 300 is depicted as including the PAs (307a, 307b) and their respective matching circuits (309a, 309b), and coupler sections (100a, 100b). In some embodiments, the module 300 of FIG. 35A can include some or all of the duplexers 410a, 410b and the switch 414. In some embodiments, the module 300 of FIG. 35B can include some or all of the filters 412a, 412b and the switch 414.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A coupler for detecting power of a radio-frequency (RF) signal, the coupler comprising:
a driver arm configured to route the RF signal; and
a coupler arm disposed proximate to the driver arm to detect a portion of the power of the RF signal, portions of the driver arm and the coupler arm forming an overlapping region, at least one of the driver and coupler arms having a non-straight arm shape including a straight section and a first side loop connected to the straight section at two connection points, the first side loop forming a single closed loop between the two connection points and having a first portion extending parallel with the straight section, the first side loop and the straight section being formed in a single plane, the non-straight arm shape further including a second side loop positioned on an opposite side of the straight section relative to the first side loop, the second side loop including a second portion extending parallel with the straight section, such that the straight section, the first side loop, and the second side loop together form a Phi shape, and the overlapping region including a non-zero lateral offset between the driver and coupler arms.

2. The coupler of claim 1 wherein the driver arm has the non-straight arm shape.

3. The coupler of claim 1 further including a phase-shifting feature implemented with respect to at least one of the driver and coupler arms to reduce a difference in phases of power ripples associated with the driver and coupler arms.

4. The coupler of claim 1 wherein the second side loop is formed in the single plane with the straight section and the first side loop.

5. The coupler of claim 4 wherein the second side loop is connected to the straight section at the two connection points and forms a second single closed loop between the two connection points.

6. A radio-frequency (RF) module comprising:
a packaging substrate having multiple layers;
a plurality of power amplifiers implemented on the packaging substrate; and a coupler assembly implemented in the packaging substrate, the coupler assembly including a first coupler configured to detect power of a first RF signal amplified by a first power amplifier of the plurality of power amplifiers, the first coupler including a driver arm configured to route the first RF signal, and a coupler arm disposed proximate to the driver arm to detect a portion of the power of the first RF signal, portions of the driver arm and the coupler arm forming an overlapping region, at least one of the driver and coupler arms having a non-straight arm shape including a straight section and a first side loop connected to and disposed on one side of the straight section and having a first portion that extends parallel with the straight section, the first side loop and the straight section being formed in a single layer of the packaging substrate, the non-straight arm shape further including a second side loop positioned on an opposite side of the straight section relative to the first side loop, the second side loop including a second portion extending parallel with the straight section, such that the straight section, the first side loop, and the second side loop together form a Phi shape, the overlapping region including a non-zero lateral offset between the driver and coupler arms.

7. The RF module of claim 6 wherein the packaging substrate includes a laminate substrate having four or more layers.

8. The RF module of claim 7 wherein the driver arm is implemented over one or more of the four or more layers, and the coupler arm is implemented below the one of the four or more layers.

9. The RF module of claim 6 wherein the coupler assembly further includes a signal path trace for one side of the coupler arm, the signal path trace configured to improve directivity performance of the coupler assembly.

10. The RF module of claim 9 wherein the coupler assembly further includes a second coupler configured to detect power of a second RF signal amplified by a second power amplifier of the plurality of power amplifiers, the second coupler including a driver arm configured to route the second RF signal, and a coupler arm disposed proximate to the driver arm to detect a portion of the power of the second RF signal.

11. The RF module of claim 10 wherein portions of the driver arm and the coupler arm of the second coupler form an overlapping region, at least one of the driver and coupler arms of the second coupler having a non-straight arm shape including a straight section and a first side loop connected to and disposed on one side of the straight section and having a first portion that extends parallel with the straight section, the first side loop and the straight section of the at least one of the driver and coupler arms of the second coupler being formed in a single layer of the packaging substrate, the overlapping region including a non-zero lateral offset between the driver and coupler arms of the second coupler.

12. The RF module of claim 11 wherein the non-straight arm shape of the second coupler further includes a second side loop positioned on an opposite side of the straight section relative to the first side loop, the second side loop including a second portion extending parallel with the straight section, such that the straight section, the first side loop, and the second side loop together form a Phi shape.

13. The RF module of claim 10 wherein the first coupler and the second coupler are connected in a chain configuration.

14. The RF module of claim 13 wherein the signal path trace for the first coupler is an input for the chain configuration of the first and second couplers.

15. The RF module of claim 6 wherein the coupler assembly further includes a phase-shifting feature implemented with respect to at least one of the driver and coupler arms of the first coupler to reduce a difference in phases of power ripples associated with the driver and coupler arms.

16. The RF module of claim On 6 wherein the second side loop is formed in the single layer of the packaging substrate with the first side loop and the straight section.

17. A radio-frequency (RF) device comprising:
a transceiver configured to process RF signals;
an antenna in communication with the transceiver, the antenna configured to transmit an amplified RF signal; and
an RF module connected to the transceiver and to the antenna, the RF module configured to generate and route the amplified RF signal to the antenna, the RF module including a coupler configured to detect power of the amplified RF signal, the coupler including a driver arm configured to route the amplified RF signal, and a coupler arm disposed proximate to the driver arm to detect a portion of the power of the amplified RF signal, portions of the driver arm and the coupler arm forming an overlapping region, at least one of the driver and coupler arms having a non-straight arm shape including a straight section and a first side loop connected to the straight section at two connection points, the first side loop forming a single closed loop between the two connection points and having a first portion extending parallel with the straight section, the first side loop and the straight section being formed in a single plane, the non-straight arm shape further including a second side loop positioned on an opposite side of the straight section relative to the first side loop, the second side loop including a second portion extending parallel with the straight section, such that the straight section, the first side loop, and the second side loop together form a Phi shape, and the overlapping region including a non-zero lateral offset between the driver and coupler arms.

18. The RF device of claim 17 wherein the second side loop is formed in the single plane with the straight section and the first side loop.

* * * * *

UNITED STATES PATENT AND TRADEMARK OFFICE
CERTIFICATE OF CORRECTION

PATENT NO. : 9,748,627 B2  
APPLICATION NO. : 14/825121  
DATED : August 29, 2017  
INVENTOR(S) : Weimin Sun et al.

Page 1 of 1

It is certified that error appears in the above-identified patent and that said Letters Patent is hereby corrected as shown below:

In the Claims

Column 24, Line 41, Claim 16, delete "On" and insert -- of --.

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*